United States Patent [19]

Kuwana

[11] Patent Number: 5,793,262
[45] Date of Patent: Aug. 11, 1998

[54] BUILD-OUT NETWORK FOR A BUILT-IN TYPE BALANCED LINE DRIVER CIRCUIT

[75] Inventor: Isamu Kuwana, Kawasaki, Japan

[73] Assignee: Fujitsu Limited, Kawasaki, Japan

[21] Appl. No.: 674,877

[22] Filed: Jul. 3, 1996

Related U.S. Application Data

[62] Division of Ser. No. 213,634, Mar. 16, 1994, Pat. No. 5,592,133.

[30] Foreign Application Priority Data

| Apr. 30, 1993 | [JP] | Japan | 5-128489 |
| Jan. 6, 1994 | [JP] | Japan | 6-11377 |
| Jan. 6, 1994 | [JP] | Japan | 6-11378 |

[51] Int. Cl.[6] .................................. H03H 11/32
[52] U.S. Cl. .................... 333/25; 375/289; 375/292; 359/117
[58] Field of Search .................... 327/165, 331, 327/362; 375/286, 289, 292; 341/57, 56; 333/20, 25; 379/377, 385, 398, 399, 400–405, 414, 415; 370/499; 359/180, 181, 184, 188, 117

[56] References Cited

U.S. PATENT DOCUMENTS

| 1,936,438 | 11/1933 | Roder | 333/25 |
| 3,638,074 | 1/1972 | Inouye | 327/110 X |
| 3,875,332 | 4/1975 | Fletcher et al. | 375/258 X |
| 3,980,826 | 9/1976 | Widmer | 375/289 X |
| 4,109,214 | 8/1978 | Main | 333/25 X |
| 4,489,222 | 12/1984 | Lusignan et al. | 379/402 |
| 4,516,245 | 5/1985 | Perry | 375/258 X |
| 4,972,106 | 11/1990 | Ruijs | 341/57 X |
| 5,555,263 | 9/1996 | Fong et al. | 379/398 X |

OTHER PUBLICATIONS

Bellcore, Generic Requirements GR–253–Core, "Synchronous Optical Network (SONET) Transport Systems: Common Generic Criteria" A Module of TSGR, FR–NWT–000440, Issue Dec. 1, 1994, pp. 2–1 to 2–3.

Bellcore, Technical Analysis Report TR–NWT–000499, "Transport Systems Generic Requirements (TSGR): Common Requirements" A Module of TSGR, FR–NWT–000440, Issue Dec. 5, 1993, pp. 9–28 to 9–30.

*Primary Examiner*—Robert Pascal
*Assistant Examiner*—Justin P. Bettendorf
*Attorney, Agent, or Firm*—Staas & Halsey

[57] ABSTRACT

A build-out Network (BON) built-in type balanced line driver circuit is provided. The (BON) built-in type balanced line driver circuit comprises a pair of transistors, the emitters of which are connected in common, and an impedance circuit connected between a power supply and respective collectors of the pair of the transistors. The impedance circuit has a reverse characteristic of the line characteristic of a balanced line connected between the collectors of the pair of transistors. The respective bases of the pair of transistors are supplied with unipolar data pulses (+DATA, –DATA).

16 Claims, 28 Drawing Sheets

| SW1 | SW2 | SW3 | SW4 | SW5 | DISTANCE | BON |
|-----|-----|-----|-----|-----|----------|-----|
| OFF | OFF | ON  | OFF | ON  | 500~750feet | 0 |
| OFF | ON  | OFF | ON  | OFF | 250~500feet | 250 |
| ON  | OFF | OFF | OFF | OFF | 0~250feet | 500 |

|  | SW1 | SW2 |
|---|---|---|
| 0~250 feet | OFF | OFF |
| 250~500 feet | ON | OFF |
| 500~750 feet | ON | ON |

|  | SW1 | SW2 |
|---|---|---|
| 0~250 feet | OFF | OFF |
| 250~500 feet | OFF | ON |
| 500~750 feet | ON | OFF |

|  | SW1 | SW2 | SW3 |
|---|---|---|---|
| 0~250 feet | OFF | OFF | OFF |
| 250~500 feet | ON | OFF | ON |
| 500~750 feet | ON | ON | ON |

BON swiching control table

| line length (feet) | control terminal | | |
|---|---|---|---|
| | A | B | C |
| 0~250 | Low | High | High |
| 250~500 | High | Low | High |
| 500~750 | High | Low | Low |

F I G. 1 8
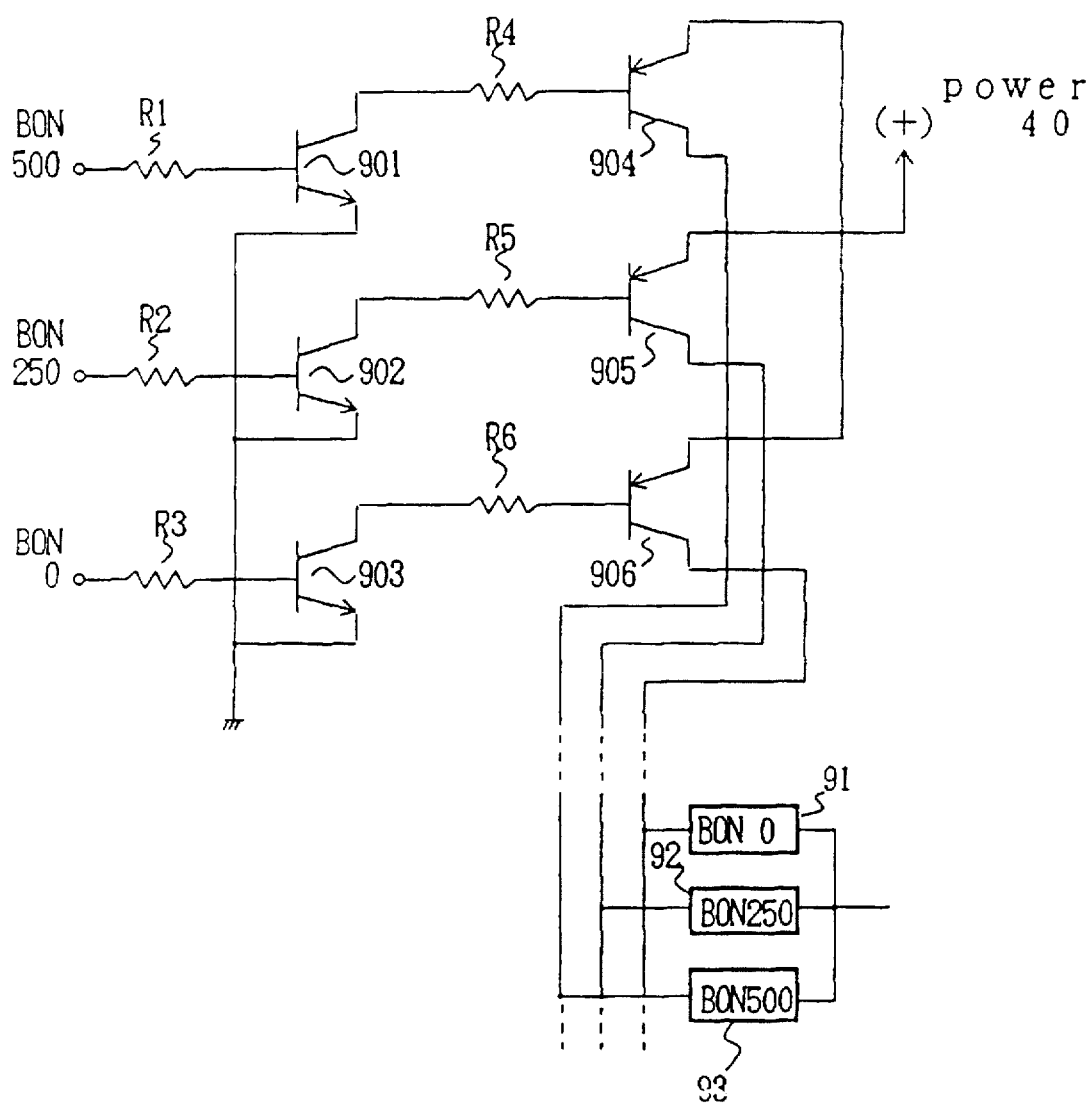

|  | SW1 | SW2 | SW3 | SW4 |
|---|---|---|---|---|
| 0~250 feet | ON | ON | OFF | OFF |
| 250~500 feet | OFF | OFF | ON | OFF |
| 500~750 feet | OFF | OFF | OFF | ON |

|  | SW1 | SW2 | SW3 | SW4 |
|---|---|---|---|---|
| 0~250 feet | ON | ON | OFF | OFF |
| 250~500 feet | OFF | OFF | ON | OFF |
| 500~750 feet | OFF | OFF | OFF | ON |

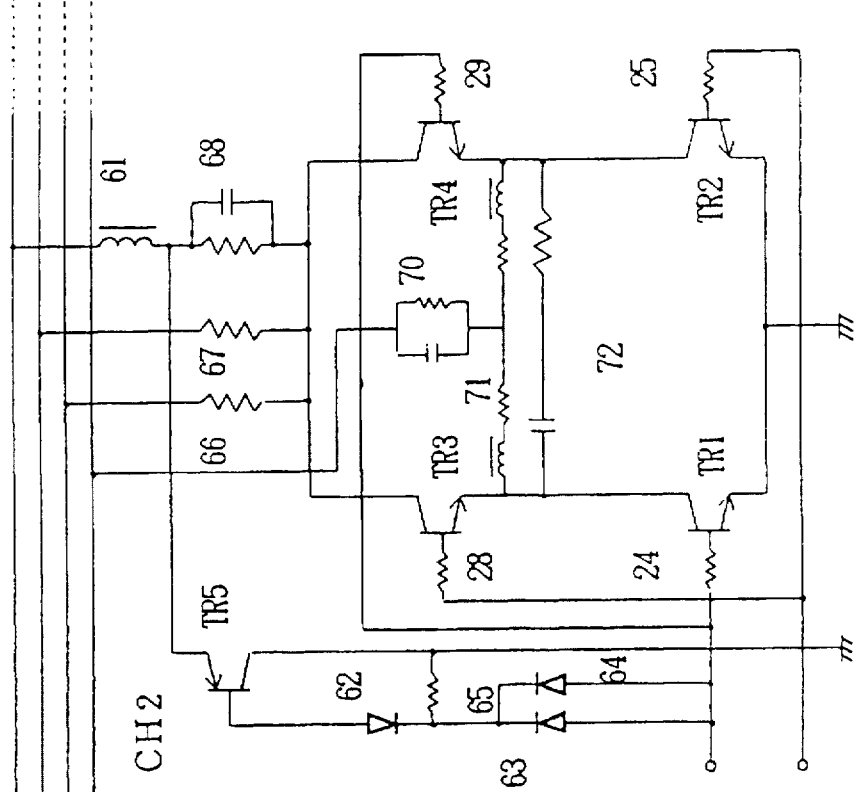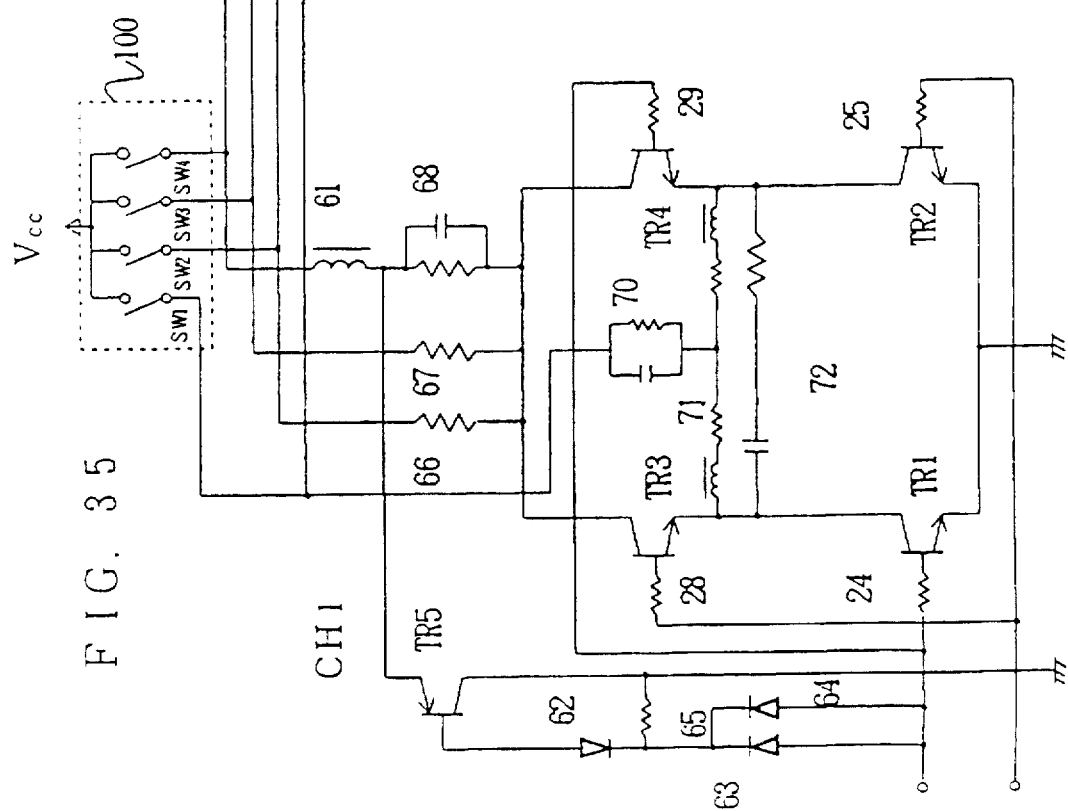
FIG. 35

BUILD-OUT NETWORK FOR A BUILT-IN TYPE BALANCED LINE DRIVER CIRCUIT

This application is a division of application No. 08/213,634, filed Mar. 16 1994, now U.S. Pat. No. 5,592,133.

BACKGROUND OF THE INVENTION

1. Field of the Invention

The present invention relates to a balanced line driver circuit having a built-in BN(build-out Network). More particularly, it relates to a BON built-in type balanced line driver circuit for converting a unipolar signal to a bipolar signal and sending-out the signal to the balanced line. Further, it relates to subscriber line termination equipment on which is provided the BON built-in type balanced line driver circuit of the present invention.

2. Related Prior Art

FIGS. 1 and 2 show a first and a second conventional circuits of a BON built-in type balanced line driver circuit. More particularly, it is a driver circuit for converting the unipolar signal to the bipolar signal and sending-out the relevant bipolar signal to the balanced line. The conventional BON built-in driver circuit separates direct current for giving the reverse characteristic for the frequency characteristic of the balanced line to the sending-out signal with separating direct current.

In FIG. 1, reference numerals "1" and "2" designate NPN type transistors, the emitters of which are commonly connected and which have a switching function wherein the transistors turn ON when positive and negative unipolar signals (+PCM, −PCM) are supplied to the bases of the transistors, alternatively.

Numeral "3" is a transformer including a primary winding 31 having an intermediate tap 32 on the primary side. In the example of FIG. 1, a bias electric power supply 4 is supplied between the commonly connected emitters of the transistors 1 and 2 and the intermediate tap 32.

A secondary winding 33 of the transformer 3 is connected to a balanced line 5 via impedance circuits 8 and 9 having the same impedance characteristic (ZA=ZB). The end of the balanced line 5 is connected to a load impedance (ZL) 6.

On the above-described structure, because the transistors 1 and 2 are turned ON when the unipolar signals (+PCM, −PCM) are supplied to the bases, alternately, the corresponding bipolar signals are outputted to the secondary winding 33 of the transformer 3.

On the other hand, the balanced line 5 has such a characteristic that the attenuation amount of high frequency components becomes larger corresponding to a line length, that is, a low-pass filter characteristic. Accordingly, it is required to compensate the attenuation amount of the high frequency components by contributing the reverse characteristic of the balanced line characteristic which is the relevant low-pass filter characteristic in advance, so that pulse signals can be received with less distortion at a load side of the balanced line 5.

The impedance circuits 8 and 9 contribute the reverse characteristic of this balanced line characteristic and are required to be provided between the secondary winding 33 and the balanced line 5 in the form of pair, to keep the balance.

The conventional structure in FIG. 2 makes the same impedance circuits 8 and 9 required in the form of pair in FIG. 1 compose one impedance circuit 11 in FIG. 1. Accordingly, the structure includes an unbalanced/balanced converting transformer 10, unlike the structure of FIG. 1.

It is possible to send the bipolar signal to the balanced line 5 for keeping the balance by the unbalanced/balanced converting transformer 10, even if it is in the case where only the impedance circuit 11 for giving the reverse characteristic of the balanced line characteristic is provided. However, it is required that the impedance characteristic of the impedance circuit 11 makes 2ZA.

And then, let us now consider about this impedance circuit 11 in detail.

FIG. 3 is a functional diagram of the conventional circuit. In the diagram, an unbalanced/balanced (U/B) converting section 71 includes the transistors 1 and 2, the transformer 3, and a section for converting the unipolar signal to the bipolar signal, in FIGS. 1 and 2.

An EQL section 72 and a BON/SW section 73 include the impedance circuits 8 and 9 or the impedance circuit 11 in FIGS. 1 and 2.

The EQL section 72 is an equalizing circuit for giving the reverse characteristic of the frequency characteristic of the line in the case where the balanced line length which is connected is longest. As shown in the diagram, the EQL section has a high-pass filter characteristic, (the less loss, the higher frequency). Further, for example, in the case where the equalizing shape is determined by the specification of the network, it is required to equal the pulse shape so as to suit the relevant specification.

FIG. 4 is one example of a pulse template for the North American DS-1 equipment provided by Bell specifications. It is required to equalize a waveform so that the equalizing shape of the waveform is within the pulse template. In the example of FIG. 4, an over shoot 80 and an under shoot 81 of the pulse is particularly required.

In FIG. 3, a BON/SW 73, having a plurality of dummy lines 731 through 733, is a circuit having the low-pass filter characteristic for connecting only one of the dummy lines 731~733 to the balanced line 5 by selectively switching the switch 734.

That is, the dummy line characteristic, having the low-pass filter characteristic, is switched and added corresponding to the balanced line length which is connected, to compensate for the dynamic range of the impedance circuits 8 and 9 and the impedance circuit 11.

For example, BON 0 (731) is a dummy line inserted in the case where the longest line length, for example, the line having the length of 500~750 feet, is connected, and the frequency characteristic is flat. The BON 0 (731) is designed so that the EQL section 72 has a equalizing characteristic for providing the reverse characteristic of the frequency characteristic of the line in the case where the length of the balanced line is longest.

The BON 250 (732) is a dummy line which is inserted in the case where the intermediate line length (250~500 feet) is connected. The BON 500 (733) is a dummy line which is inserted in the case where the shortest line length (0~250 feet) is connected.

In FIG. 3, numeral "5" is the balanced line explained in FIG. 1, having the low-pass filter characteristic corresponding to the length. "6" is a load circuit, for example, a cross connect circuit as the latter-described.

FIG. 5 is a detail diagram of the conventional circuit, which is corresponding to the structure of the second conventional circuit in FIG. 2. FIG. 6 is a diagram showing the relation between the combination of ON and OFF of each switch in FIG. 5 and the kind of BON. Further, the same or similar numerals to those shown in FIGS. 1 through 4, are shown the same reference numbers and symbols.

In FIG. 5, transformer 3 is shown with abridgment of the bias circuit. T and R are two terminals connected to the balanced line 5. The EQL section 72 is a high-pass filter constituted of the capacity C1 through C4, the resisters R1 through R3 and an inductor L1.

The BON/SW section 73 has the resisters R5 through R14, the inductors L2 through L3 and the condensers C5 through C6 as the elements constituting BON, and the switch 734 has SW1 through SW5.

The BON 0 (731), the BON 250 (732) and the BON 500 (733) include the combination of these switches SW1 through SW5. The combinations of switches are shown in the table of FIG. 6. For example, BON 0 (731) includes SW3 and SW5 in an ON state and SW1, SW2 and SW4 in an OFF state. The conventional circuits as shown and described in FIGS. 1–6 have several problems as follows;

That is, the same impedance compensating circuits 8 and 9 (ZA, ZB) must be connected to the balanced line 5, to keep the balance on the structure of FIG. 1. Further, in the circuit of FIG. 2, although only the one compensating impedance circuit 11 is required, the unbalanced/balanced converting transformer 10 becomes necessary.

On the other hand, as the BON built-in type balanced line driver circuit having the unipolar or the bipolar signal converting circuits are provided on a low-rank group channel unit, it must have the same number of driver circuits as channels. Accordingly, a pair of the same impedance compensating circuits are required, or the unbalanced/balanced converting transformer is required in the conventional circuit. In either case, the scale of the circuit becomes larger. Thus, it interferes with reducing the size of the equipment and reducing the cost.

SUMMARY OF THE INVENTION

It is therefore an object of the present invention to provide a BON built-in type balanced line driver circuit to reduce the size of the equipment and lower costs, by deleting the overlapping impedance compensating circuits and an unbalanced/balanced converting transformer.

A further object of the present invention is to provide a BON built-in type balanced line driver circuit, having one impedance circuit as a compensating circuit for the frequency characteristic of the balanced line, and deleting an unbalanced transformer.

A still further object of the present invention is to provide subscriber line termination equipment, which is provided with a BON built-in type balanced line driver circuit for reducing the size of the equipment and reducing the cost.

A more particular object of the present invention is to provide a BON built-in type balanced line driver circuit including: a U/B converting transformer including the primary winding having the immediate tap and the secondary winding connected to the balanced line; first and second switch circuits connected between both terminals of the primary winding of the U/B converting transformer; and an impedance circuit inserted between the said intermediate tap and the connecting point of the first and the second switch circuits, in which the impedance circuit has a reverse frequency characteristic of the frequency characteristic of the balanced line, the first and second switch circuits are conductive with unipolar pulse signals, alternately, and the secondary winding of the U/B converting transformer outputs bipolar pulses contributed by the reverse frequency characteristic.

A further object of the present invention is to provide a BON built-in type balanced line driver circuit, in which the impedance circuit can be switched easily corresponding to the frequency characteristic of the connected balanced line.

A still further object of the present invention is to provide a structure so as to provide the above-described BON built-in type balanced line driver circuit in channel units on subscriber line termination equipment for converting bipolar signals of the low-rank group to optical multiplexing signals and converting the optical multiplexing signals of the high-rank group to the bipolar electric signals of the low-rank group.

A still further object of the present invention is to provide a BON built-in type balanced line driver circuit including a pair of transistors having commonly connected emitters, collectors, connected to an impedance circuit, which is fixed or switched corresponding to a balanced line length connected to the circuit.

The present invention provides a BON built-in type balanced line driver circuit including a pair of transistors, the emitters of which are connected in common, and an impedance circuit connected between a power supply and respective collectors of the pair of the transistors having the reverse characteristic of the line characteristic of a balanced line, which is connected between the collectors of the pair of transistors, the respective bases of the pair of transistors being supplied with unipolar data pulses (+DATA, –DATA).

Further, other objects of the present invention become clear by the description of the preferred embodiments and the attached drawings.

BRIEF DESCRIPTION OF THE DRAWINGS

The accompanying drawings, which are incorporated in and constitute a part of the specification, illustrate presently preferred embodiments of the present invention, and together with the general description given above and the detailed description of the preferred embodiments given below, serve to explain the principles of the invention:

FIG. 18 is a diagram showing a first structural example of the switch circuit.

FIG. 35 is a diagram showing a fifteenth embodiment of the present invention.

DESCRIPTION OF THE PREFERRED EMBODIMENTS

Figure 7:
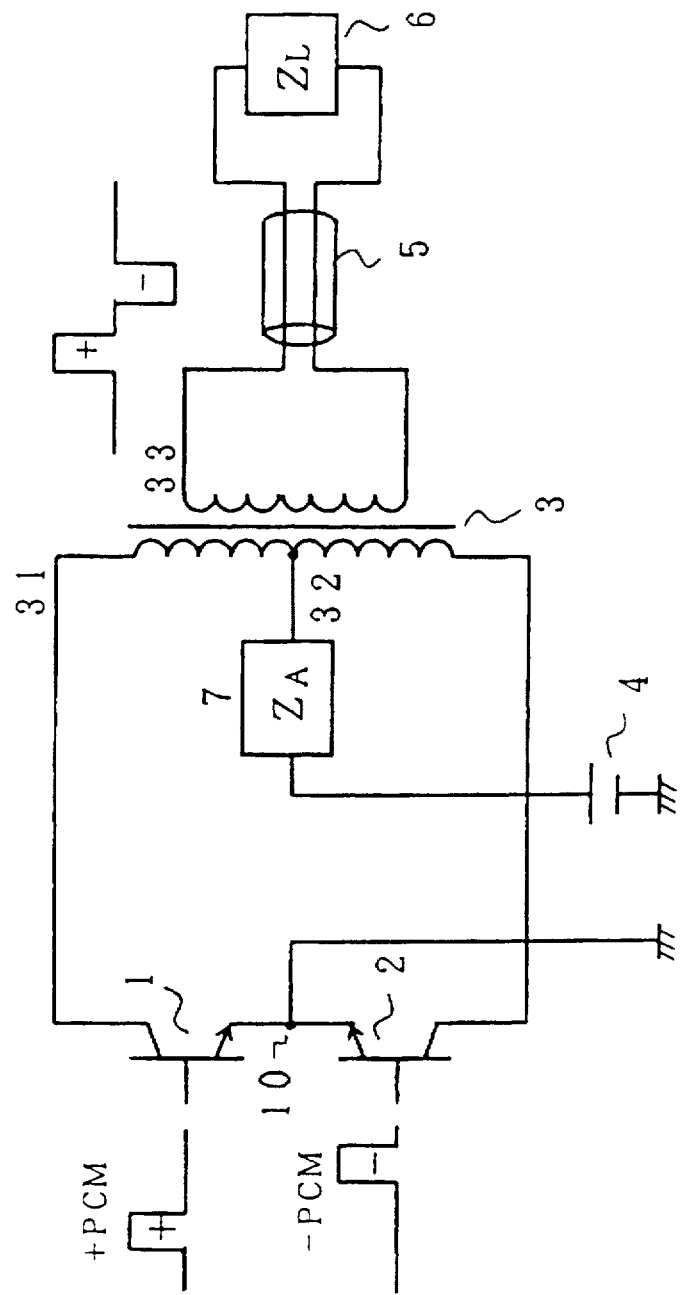
FIG. 7 is a principle diagram of the present invention.

FIG. 7 is a diagram explaining the principle of the present invention. In the diagram, reference numerals "1" and "2" are transistors which become a first switch circuit and a second switch circuit. In FIG. 7, these transistors are shown as the NPN type transistors, but the type of transistor is not limited on the principle of the present invention.

"3" is an U/B converting transformer having an intermediate tap 32 on a primary winding 31 and having a secondary winding 33. An impedance circuit 7 is connected to the intermediate tap 32 of the primary winding 31 of the U/B converting transformer 3.

Further, the secondary winding 33 of the U/B converting transformer 3 is connected to the tip-ring both lines of the balanced line 5.

Numeral "4" is a bias direct-current power supply, which is connected between the impedance circuit 7 and a common connecting point 10 of the first and second switch circuits 1 and 2 (in the diagram, it is the common emitter). "6" is a load impedance, corresponding to, for example, a cross connect switch.

Let us explain the circuit operation of FIG. 7 as follows.

The unipolar pulse which is corresponding to the pulse signal +PCM and the pulse signal –PCM is alternately inputted to each of bases of both transistors, which are the switch circuits 1 and 2.

When the pulse signal (+PCM) is inputted to the base of the transistor 1 which is the first switch circuit, the transistor 1 becomes conductive, so that the current supplied from the power supply 4 flows from the intermediate tap 32 of the primary winding 31 of the transformer 3 to the collector of the transistor 1 via the impedance circuit 7.

Accordingly, the pulse signal (+PCM) is outputted to the secondary winding 33 of the U/B converting transformer 3. On the other hand, when the pulse signal (+PCM) is finished, both transistors 1 and 2 become nonconductive, and the pulse signal (–PCM) is inputted to the base of the transistor 2.

Accordingly, the transistor 2 becomes conductive, so that the current flows to the collector of the transistor 2 vita the impedance circuit 7 and the intermediate tap 32 of the primary winding 31 of the U/B converting transformer 3.

Then, the pulse signal (–PCM) is outputted to the secondary winding 33 of the U/B converting transformer 3.

In this way, the bipolar pulse signal is outputted to the secondary winding 33 of the U/B converting transformer 3. This outputted bipolar pulse signal is connected to the tip-ring both lines of the balanced line 5 and transmitted to the load impedance 6.

The impedance circuit 7 is a circuit for providing the impedance characteristic, which is the reverse characteristic to the frequency characteristic, to compensate the frequency characteristic of the balanced line S, as has already been explained relating to the conventional circuit.

Accordingly, the pulse current flowing from the power supply 4 becomes a pulse current shaped by the reverse frequency characteristic of the frequency characteristic of the balanced line S according to the impedance circuit 7, and is outputted as the pulse signal-corresponding to the secondary winding 33 of the U/B converting transformer 3.

The frequency characteristics specified by the impedance circuit 7 is further specified by the balanced line S in the reverse direction. The bipolar signal, corresponding to the original input unipolar signal formed with the shape compensating the frequency characteristic of the balanced line 5, is received on the negative side in the load impedance 6, after all.

As shown in FIG. 7, the impedance circuit 7 is provided between the primary winding of the U/B converting transformer 3 and the first and the second switch circuits 1 and 2 of the present invention.

Accordingly, the unbalanced circuit is converted to the balanced circuit by the U/B converting transformer 3, so that the bipolar signal can be outputted.

Figures 8, 9:
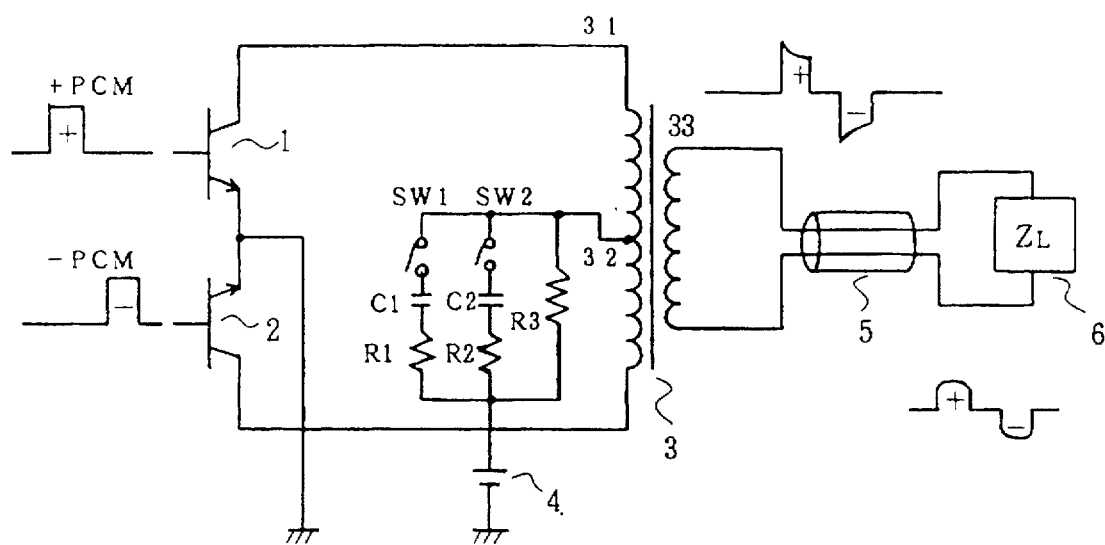
FIG. 8 is a diagram showing a first embodiment of the present invention.
FIG. 9 is a diagram showing the example of the switching combination of the first embodiment.

FIG. 8 shows a first embodiment of the present invention and it is a circuit diagram including the embodiment of the impedance circuit shown in FIG. 7.

The impedance circuit 7 in the first embodiment shown in FIG. 8 has a first series connection of a first resister $R_1$ and a capacitor $C_1$, a second series connection of a second resister $R_2$ and a capacitor $C_2$ and a third resister $R_3$. The third resister $R_3$ is inserted between the intermediate tap 32 of the primary winding 31 of the U/B converting transformer 3 and the direct-current power supply 4.

Further, the first series connection and the second series connection are selectively connected to the third resister $R_3$ by the switches SW1 and SW2, respectively.

The above-described structure of the impedance circuit shown in FIG. 8 is basically a high-pass filter. Accordingly, the compensating impedance circuit, corresponding to the length of the balanced line 5, includes the combination of the switches SW1 and SW2 as shown in FIG. 9.

In the case where the balanced line 5 is within the shortest range, that is, the range of 0 through 250 feet, the switches SW1 and SW2 are turned to OFF states, so that only the resister $R_3$ is an element of the impedance circuit 7.

When the balanced line 5 is within the intermediate distance range, that is, the range of 250 feet through 500 feet, only the switch SW1 is turned to ON state. Then, when the balanced line 5 is within the longest line range, that is, the range of 500 feet through 750 feet, both of the switches SW1 and SW2 are turned to ON state.

Accordingly, the impedance circuit 7 provides the equalizing characteristic for the higher frequency as the high-pass filter circuit, in the case where the balanced line 5 is in the longest range.

The waveform of the bipolar pulse appeared on the secondary winding 33 of the U/B converting transformer 3 in FIG. 8 is as shown in the right upward section of the diagram. That is, the waveform, appearing on the secondary winding 33, has the sharp over shoot section on the leading edge of the bipolar pulse, because the exciting current for exciting the primary winding 31 of the U/B converting transformer 3 is added to the pulse current.

When this bipolar pulse signal reaches the load impedance 6 via the balanced line 5, the over shoot section of the bipolar pulse is made smooth with the low-pass filter characteristic of the balanced line 5 and supplied to the load impedance 6, as shown in FIG. 8.

The setting value of the capacitors $C_1$, and $C_2$ and the resisters $R_1$, $R_2$ and $R_3$ are set to be the attenuation amount on the center value of the relevant line length range, when the line length range is selected by the switches SW1 and SW2 as shown in FIG. 9.

As explained above, the impedance circuit has the parallel connection of CR in FIG. 8. In contrast, the inductor is used in the structure of the impedance circuit 7 on the second embodiment of the present invention as shown in FIG. 10.

Figures 10, 11:
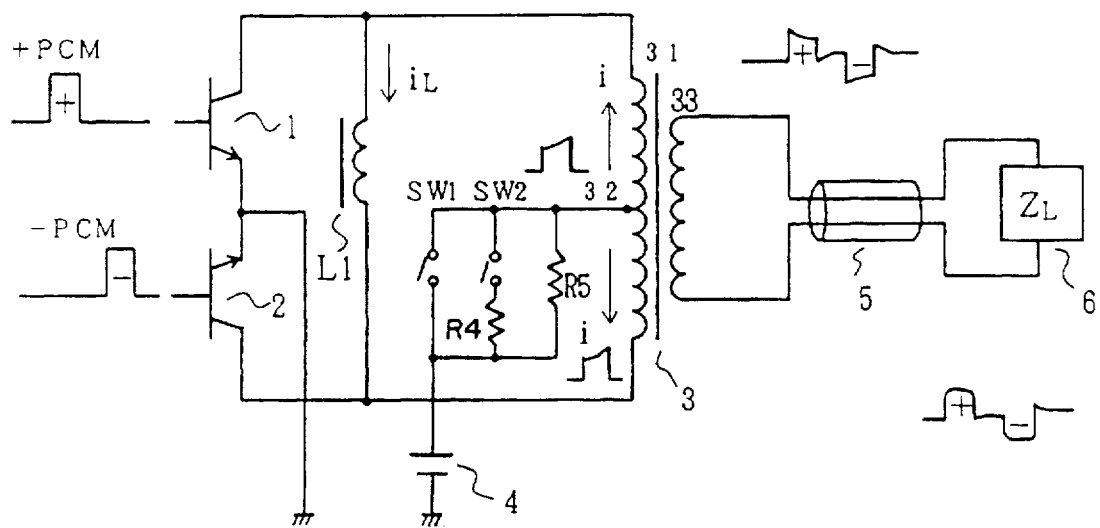
FIG. 10 is a diagram showing a second embodiment of the present invention.
FIG. 11 is a diagram showing the example of the switching combination of the second embodiment.

As the circuit is shown in FIG. 10, the inductor $L_1$ is inserted between both ends of the primary winding 31 of the U/B converting transformer circuit 3.

Further, the resister $R_5$ is inserted between the intermediate tap 32 of the primary winding 31 and the direct-current power supply 4 and the switch SW1 and the series circuit of the switch SW2 and the resister $R_4$ are placed so as to be capable to connect this resister $R_5$ in parallel.

The combination of these switches SW1 and SW2 is selected corresponding to the length of the balanced line 5 as explained relating to FIG. 8.

That is, as shown in FIG. 11, in the case where the balanced line 5 having the intermediate length (250–500 feet) is used, the switch SW1 is turned to OFF state and the switch SW2 is turned to ON state. Further, when the switch SW1 is turned to ON state, that is the balanced line 5 is within the longest range (500–750 feet), the register $R_5$ becomes the short-circuit.

Figure 1:
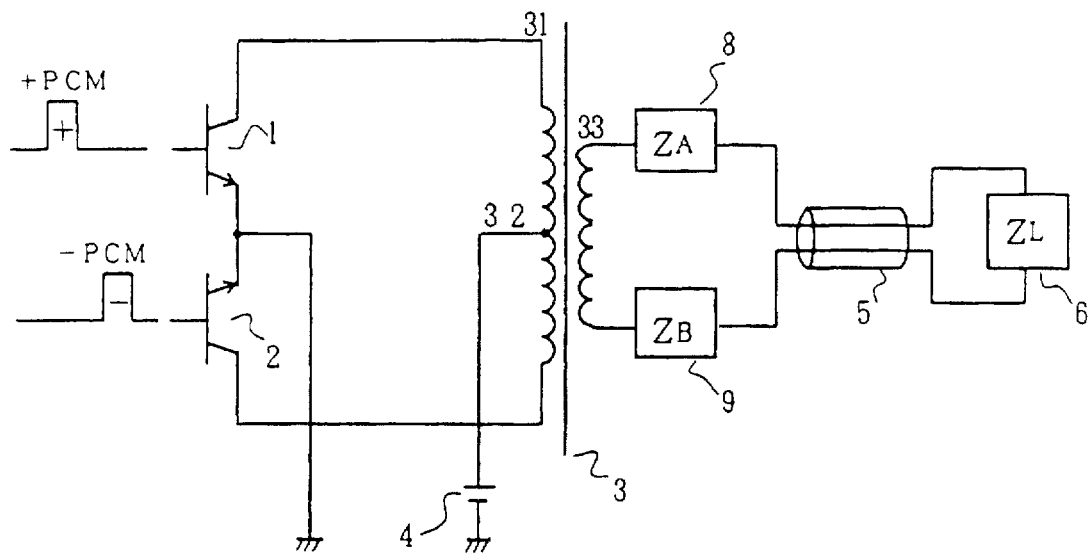
FIG. 1 is a diagram showing a first conventional circuit.
Figure 2:
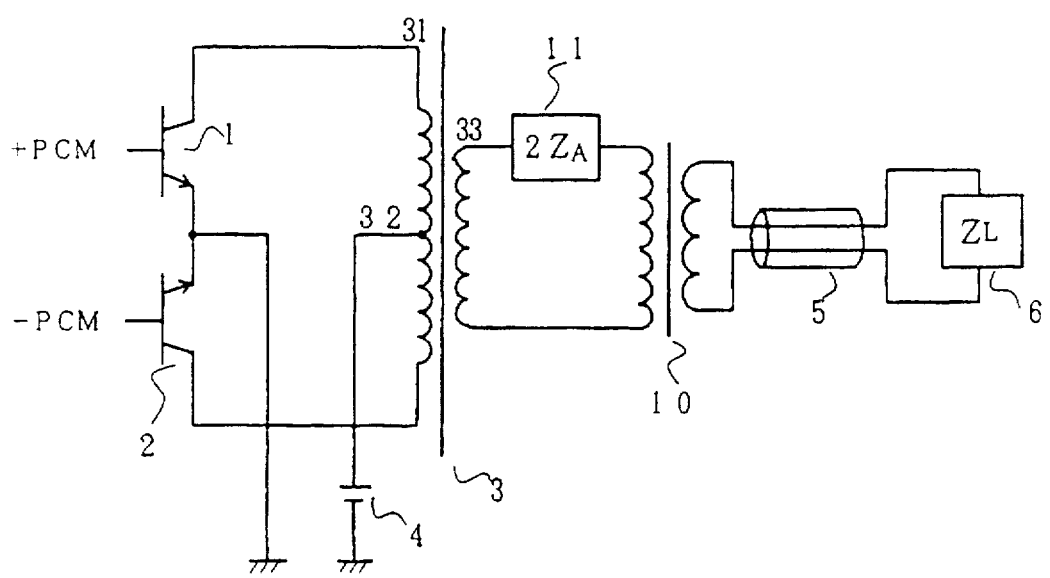
FIG. 2 is a diagram showing a second conventional circuit.
Figure 3:
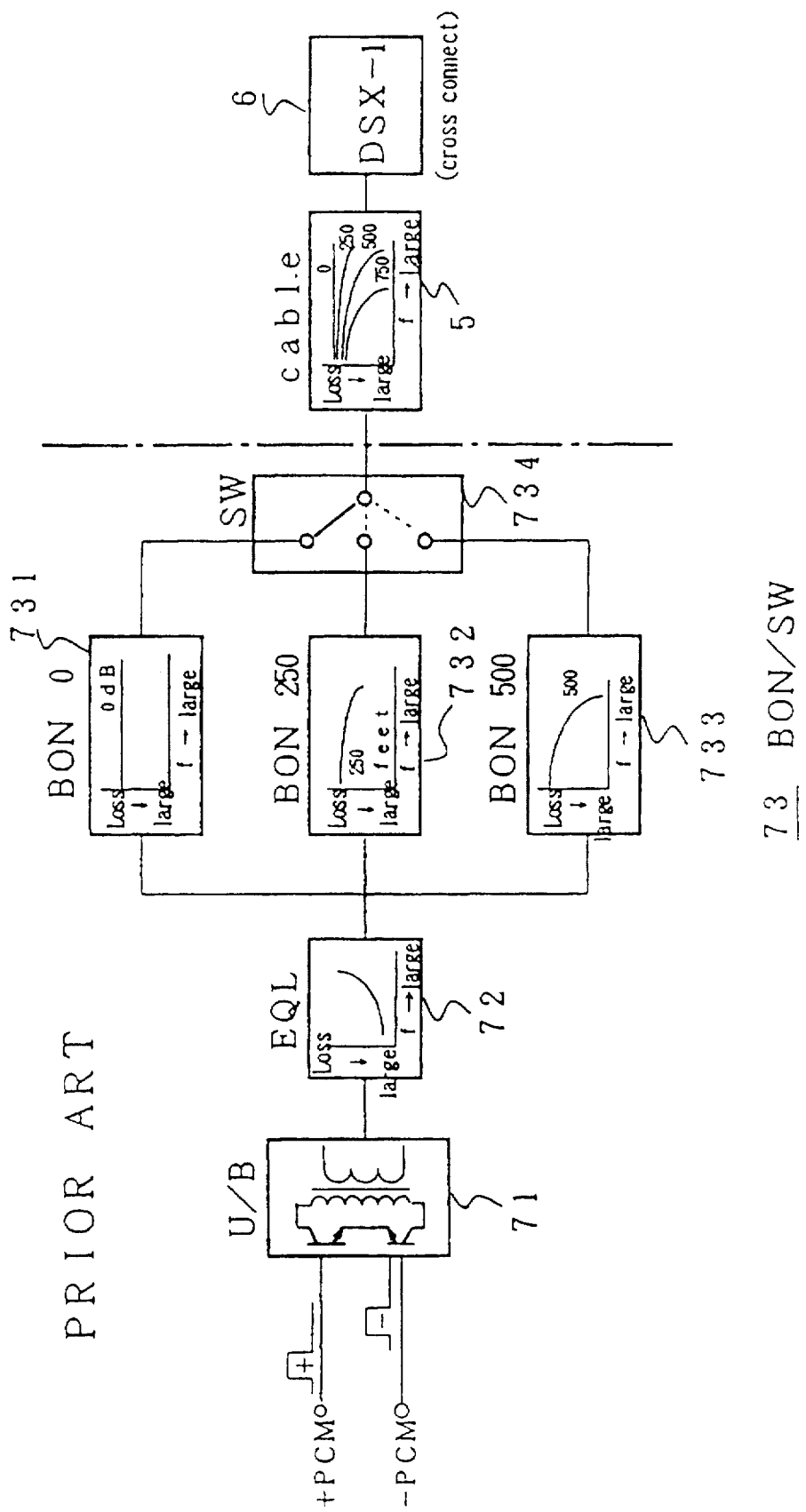
FIG. 3 is a diagram explaining the function of the conventional circuit.
Figure 4:
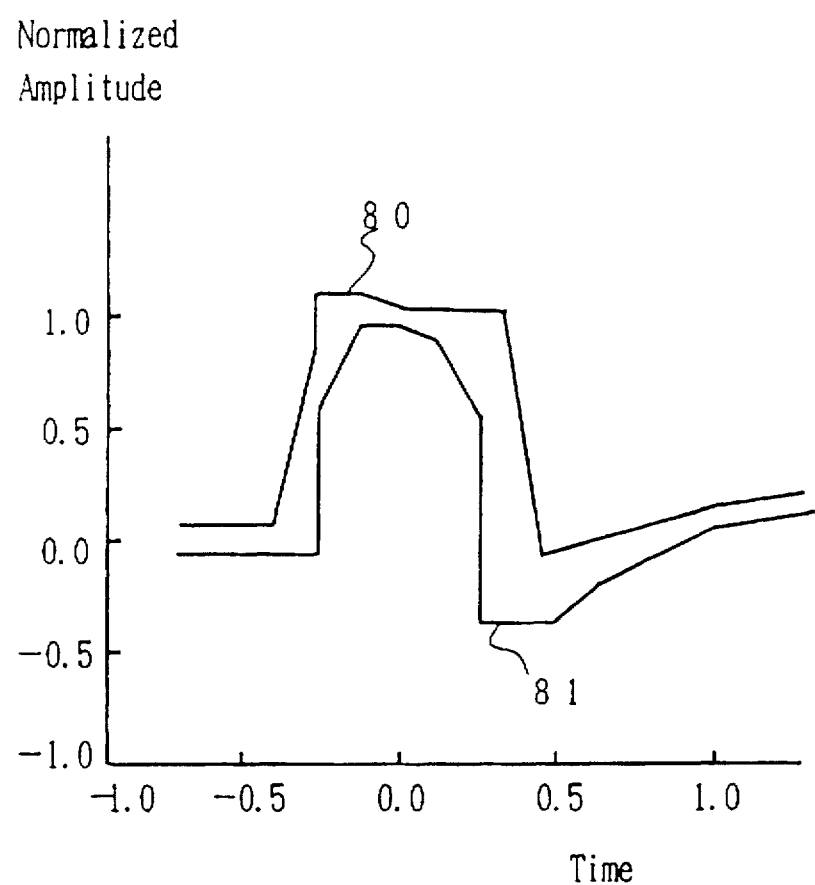
FIG. 4 is a diagram showing one example of a pulse template.
Figures 5, 6:
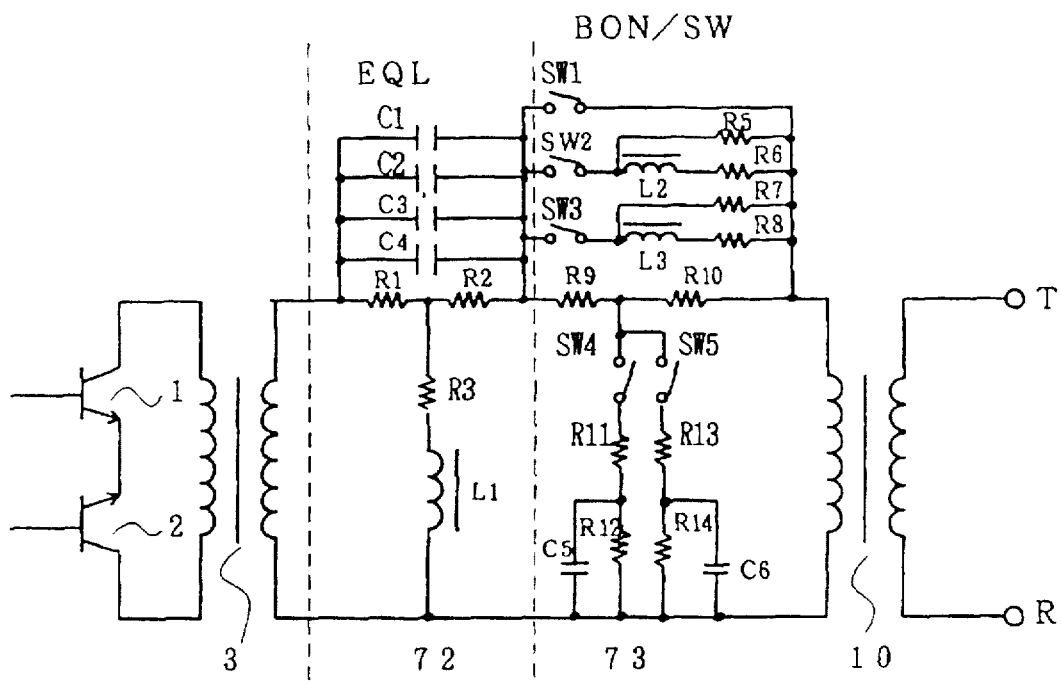
FIG. 5 is a diagram showing a detail diagram of the conventional circuit.
FIG. 6 is a diagram showing the example of the switching combination of the conventional circuit.

It is a feature of the embodiment in FIG. 10 that the bipolar pulse can be outputted in the case where the over shoot 80 and the under shoot 81 are required, as explained above in the one example of the pulse template of FIG. 4.

Now, the transistor 1 is turned to ON state, when the pulse on the positive side is supplied to the base of the transistor 1, so that the electric-current from the battery 4 flows via the winding above the intermediate tap 32 of the primary winding 31 of the U/B converting transformer 3, to the collector of the transistor 1. Then, as it is required that the exciting current is piled up for the pulse current as explained relating to FIG. 8, the current of the over shoot flows as shown in the drawing.

Further, the reverse electric generation accumulated in the inductor $L_1$ flows to the primary winding of the U/B converting transformer 3 within a period of time when the transistors 1 and 2 are in OFF state. Therefore, as shown in the output of the secondary winding 33 of FIG. 10, the bipolar pulse signal has the section of the over shoot on the leading edge, and has the section of the under shoot on the trailing edge at the same time.

When this bipolar pulse signal is sent to the load impedance 6 via the balanced line 5, the over shoot on the section of leading edge of the bipolar pulse becomes a smooth signal, as shown in FIG. 10, with the low-pass filter characteristics of the balanced line 5, and the signal is inputted to the load impedance 6.

Figures 12, 13:
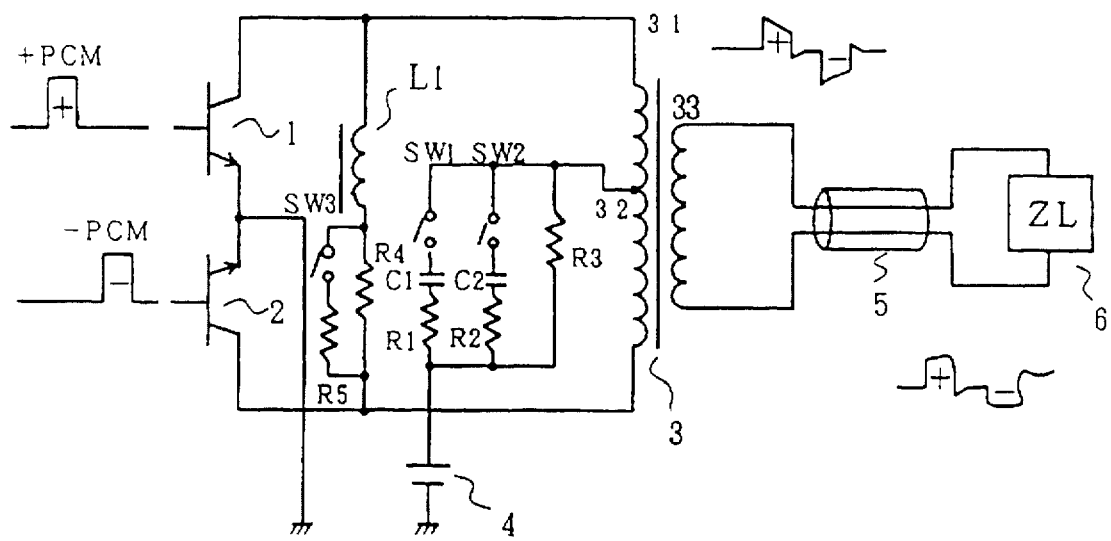
FIG. 12 is a diagram showing a third embodiment of the present invention.
FIG. 13 is a diagram showing the example of the switching combination of the third embodiment.

FIG. 12 is a circuit diagram showing the structure of the impedance circuit 7 as the third embodiment of the present invention.

On this third embodiment, it is possible to perform the finer approximate compensation. That is, the register $R_4$ connected to the inductor $L_1$ in series and the resister $R_5$ which can be connected and disconnected by the switch SW3 in parallel to the relevant resister $R_4$ exist in the inductor $L_1$ inserted to both ends of the primary winding of the U/B converting transformer 3.

Further, the element inserted between the intermediate tap 32 of the primary winding 31 of the U/B converting transformer 3 and the direct current power supply 4 is the same as shown in FIG. 8, and the element includes the switches SW1 and SW2, to constitute the parallel circuit of CR.

On this third embodiment, as shown in the diagram, the bipolar pulse signal having the over shoot and the under shoot is outputted to the secondary winding 33 of the U/B converting transformer 3 and sent to the load impedance 6 via the balanced fine 5.

Accordingly, as it has already been explained in relation to the first embodiment and the second embodiment of the present invention, the bipolar signal appeared in the secondary winding 33 by the low-pass filter characteristic of the balanced line 5 becomes the pulse signal, in which the leading edge and the trailing edge are made smooth, as shown in the diagram on the load impedance 6.

As described above, the impedance circuit 7 has switches SW1, SW2 and SW3 to perform the finer approximate compensation on the third embodiment, so that the combination of these states of ON and OFF is shown in FIG. 13.

That means the switches SW1, SW2 and SW3 are in the ON state together, in the case where the balanced line 5 is within the range of the longest length (500–750 feet).

The waveform of the current flowing to the primary winding of the U/B converting transformer 3 and the current of bipolar pulse appeared on the secondary winding 33 are same as one explained in FIG. 9.

Further, as explained in relation to the first embodiment of FIG. 8, the setting values of the inductor, the resister and the capacitor are decided so as to be the compensating amount on the central value within the range of the selected line length, which is also the same as in the embodiments of FIGS. 10 and 12.

Figures 14, 15:
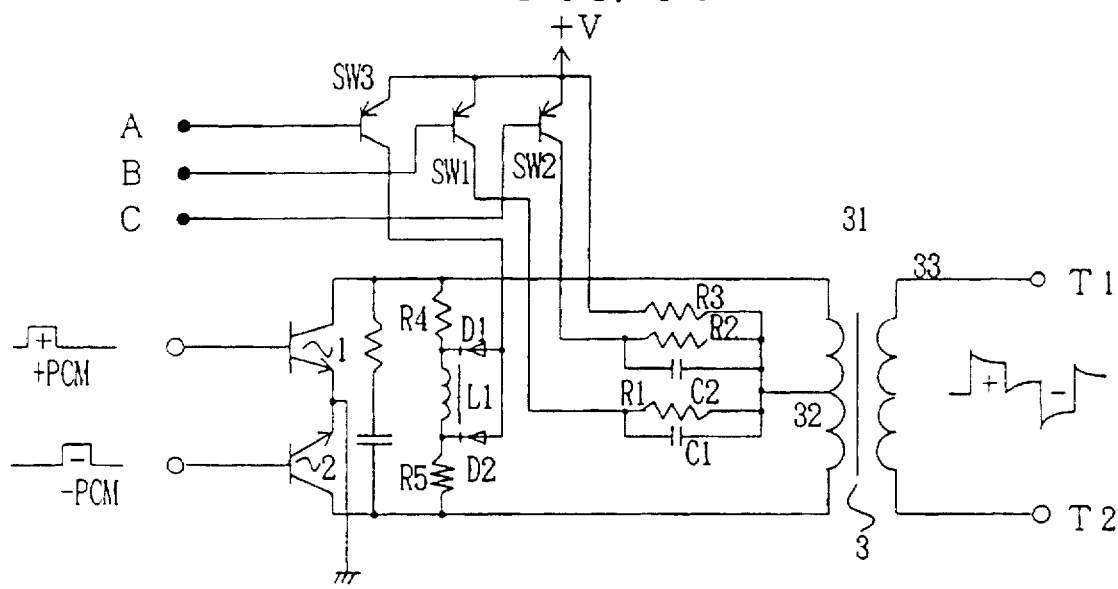
FIG. 14 is a diagram showing a fourth embodiment of the present invention.
FIG. 15 is a diagram showing the example of the switching combination of the fourth embodiment.

FIG. 14 is a fourth embodiment of the present invention. More particularly, it is a structural example of the switches SW1 through SW3 on the third embodiment. The switches SW1 through SW3 are selected by using the bipolar transistors, respectively.

In the example of FIG. 14, the common emitter of the bipolar transistors, which become the switches SW1 through SW3 are connected to the voltage +V. Each conductivity is controlled by the control signals inputted to the terminals A, B and C.

The collector of the transistor corresponding to the switch SW3 is connected to both ends of the inductor $L_1$ via the diodes D1 and D2. In the case where the line length of the line connecting this BON setting circuit is short, the control signal A on the base of the switch SW3 is inputted and the transistor of the switch SW3 becomes to be in ON state and supplies the voltage +V so as that the diodes D1 and D2 are in ON state, when the level of this signal is low.

In this situation, the current flows to the resisters $R_4$ or $R_5$, and the situation is the same as the case where the switch SW3 disconnected to the resister $R_5$ is turned to OFF state in FIG. 12. FIG. 15 is a diagram showing the relation of the level of the control signals inputted to each terminal A, B and C, corresponding to each line length.

In FIG. 15, when the level of the control signal inputted to each terminal A, B and C is low, the corresponding transistor is in ON state, that means, the switch is in ON state. On the other hand, when the level is high, the corresponding transistor is in OFF state, that means, the switch is in OFF state. Accordingly, it is understood that the relation of the level of the control signals of FIG. 15, which is inputted to the terminals A, B and C is corresponding to the relation of ON/OFF of the switches SW1 through SW3 of FIG. 13.

Heretofore, the maintenance operator of the equipment took out the panel stored in the form as the shape of a card from the equipment and operated, selecting the combination of ON/OFF, the Dip switches SW1 through SW3 provided on the panel to correspond to the line length which is connected.

In opposite, by the structure of SW1 through SW3 in FIG. 14, it is possible to, for example, give the fixed level of the control signal per terminals A, B and C with the micro computer control, automatically. Accordingly, it relieves the work load of the maintenance operator and improves the maintenance remarkably.

Figure 16:
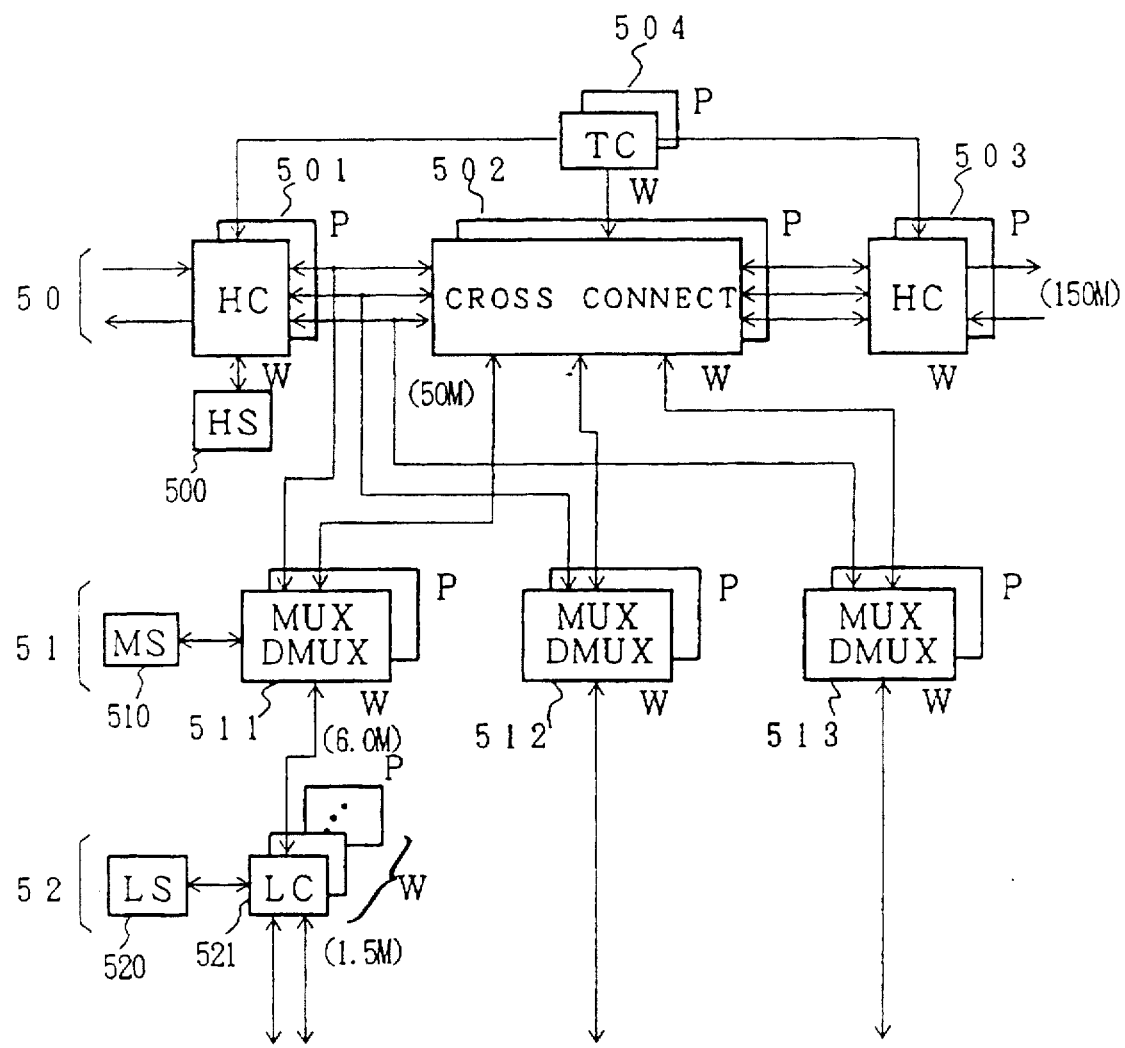
FIG. 16 is a diagram explaining a first applied example of the circuit of the present invention.

FIG. 16 is a block diagram showing the first applied example of the BON built-in type balanced line driver circuit according to the first through the fourth embodiments of the present invention. FIG. 16 is a diagram showing the structure of the subscriber line termination equipment (LTE) on the optical multiplexing transmission equipment.

50 is a section connecting to the transmitter for transmitting the optical multiplexing signal of 150 MHz. The interface units 501 and 305 are provided here, and the cross connect unit 502 is provided between the interface units 501 and 503.

Further, the clocks are supplied from the clock supply unit 504 to the interface unit 503 and the cross connect unit 502. Each of these units are made with the double structure having the unit for work W and the unit for protect P. 500 is a switch controller for switching the unit for work and the unit for protect.

The cross connect unit 502 is a unit for replacing the time base with the speed of 50 MHz bit.

On the other hand, the interface units 501 and 503 are the units for multiplexing the signal of 50 MHz outputted from the cross connect unit 502, converting the signal of 50 MHz to the signal of 150 MHz and performing to multiplex and separate from 150 MHz to 50 MHz.

51 is an intermediate group unit including the multiplexor/demultiplexor units 511, 512 and 513 which supply the signal of 50 MHz for the cross connect unit 502, receive the signal 50 MHz from the cross connect unit 502 and convert the signal to the signal of 6 MHz of the low-rank group.

These multiplexor/demultiplexor units 511, 512 and 513 are made with the double structure having the unit for work W and the unit for protect P as same as the high-rank group unit. 510 is a switch controller for switching the unit for work and the unit for protect.

On the other hand, 52 is a low-rank group unit, which sends and receives the signal of 6 MHz to and from the intermediate group unit 51 and converts it to the signal of 1.5 MHz which is sent and received to and from terminal units, not shown in the diagram.

521 is a low-rank group channel panel for converting the signal of 6 MHz and the signal of 1.5 MHz. This low-rank group channel panel 521 has a structure of N to 1 constituted from a plurality of panels for work (W) and a sheet of panel for protect (P). 520 is a switch controller for switching the channel panel for work W and the channel panel for protect P.

The BON built-in type balanced line driver circuit according to the present invention is applied as one example to this low-rank group channel panel. The low rank group channel panel is 8 sheets in total, which has 7 sheets for the panel for work and 1 sheet for the panel for protect. The circuit requiring 4 channels are stored in one sheet of channel panel. One BON built-in type balanced line driver circuit according to the present invention is provided for each channel of the low-rank group.

Accordingly, it is understood for reducing the size of lower-rank group channel panel 521 that there is much merit caused by miniaturizing the BON built-in type balanced line driver circuit according to the present invention.

Figure 17:
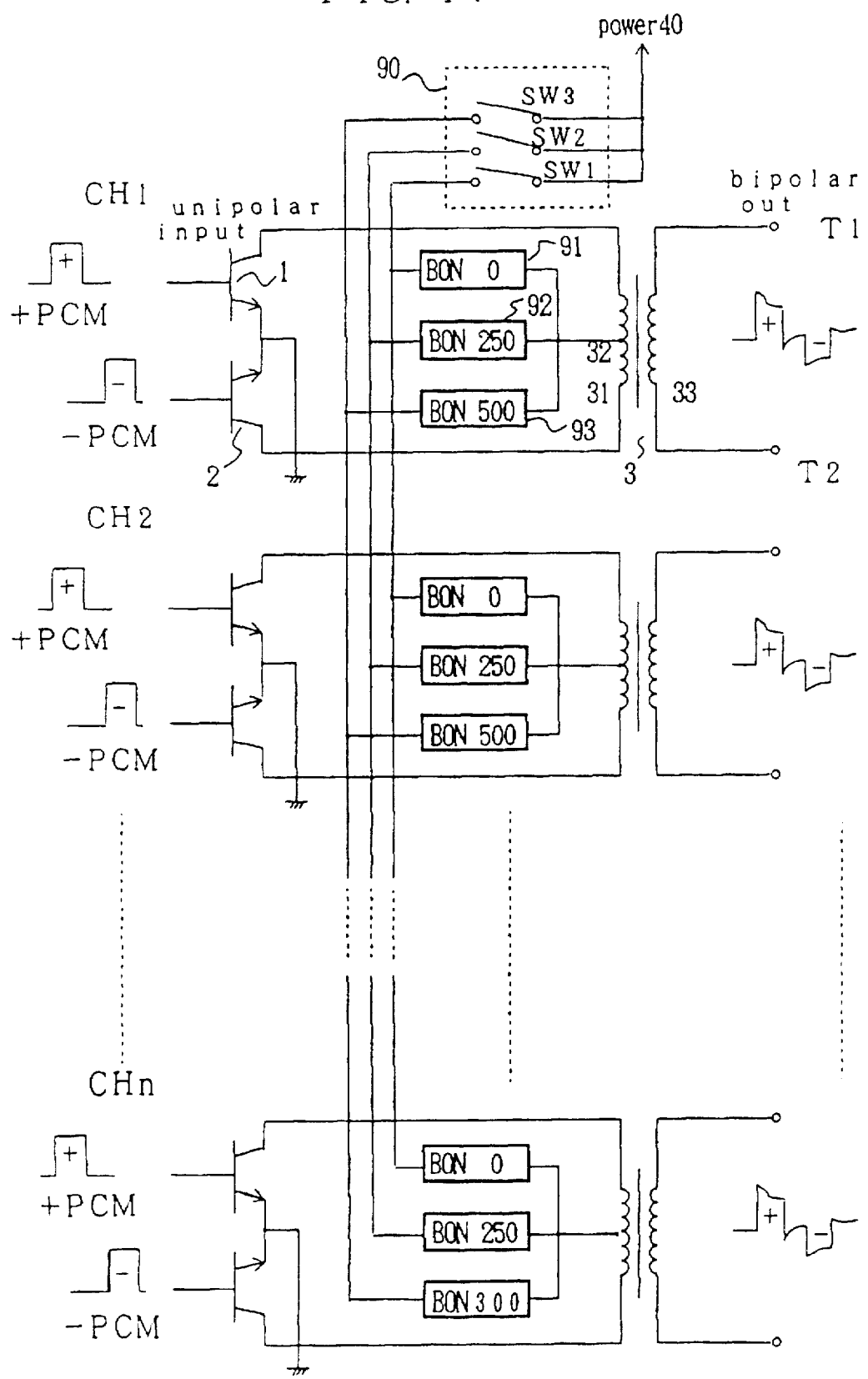
FIG. 17 is a diagram showing a fifth embodiment of the present invention.

FIG. 17 is a diagram showing a fifth embodiment of the present invention.

In FIG. 17, although the redundancy system of the unit for work (W) and the unit for protect (P) is explained as the first applied example of the circuit of the present invention, the length of the transmitter of each channel (CH) is same in this case. Accordingly, the setting of BON is also same.

Therefore, the embodiment of FIG. 17 shows the structure for having the switch circuit for the BON setting for each channel in common, considering this characteristic.

In FIG. 17, the BON setting circuit having the common structure is provided respectively, for the channels CH1 through CHn.

Let us now consider the structure of the channel 1 (CH1) on behalf. The transistors 1 and 2 are transistors for making to be ON/OFF for the unipolar inputs +PCM and −PCM, respectively.

The BON 0 circuit 91, the BON 250 circuit 92 and the BON 500 circuit 93 are connected to the intermediate tap 32 which is included in the primary winding 31. The balanced line is connected to the secondary winding 33 of the transformer 3 via the terminals T1 and T2.

Further, one ends of the BON circuits 91 through 93 are connected to the intermediate tap 32 in common, and other ends of the BON circuits are connected to the common switch circuit 90.

This common switch circuit 90 has the switches SW1 through SW3, and one ends of the switches connected to the plus power supply 40 in common. The other ends of the switches are connected to the corresponding BON circuits 91 through 93, respectively.

Hereupon, the BON circuits 91 through 93 are the impedance circuits for giving the characteristic reverse to the transmitting characteristic of the fixed length transmission line, respectively.

When either of the switches SW1 through SW3 of the switch circuit 90 makes to be in ON state, the electric power source 40 is supplied to the corresponding one of the BON circuits 91 through 93.

The advantages offered by this structure of FIG. 17 are to make the switch circuit for the BON setting for each channel in common, and reduce the structure of the BON setting circuit, that is an essential object of the present invention.

FIG. 18 is a diagram showing the first structural example of the switch circuit 90 in FIG. 17, concretely.

The structure of the BON setting circuit of each channel is abbreviated in FIG. 18, and a part of the structure of the BON setting circuit, that is, a part of the BON 0 circuit 91 through the BON 500 circuit 93 is shown.

In FIG. 18, the switch SW1 is constituted to have the transistors 903 and 906 and the base resisters R3 and R6.

The collector of the transistor 903 is connected to the base of the transistor 906 via the base resister R6 of the transistor 906.

The resisters R2 and R5 are connected to each base of the transistors 902 and 905 constituting the switch SW2 and the collector of the transistor 902 is connected to the base of the transistor 905 via the base resister R5, similarly.

Further, the switch SW3 has the transistors 901 and 904 and has the base resisters R1 and R4 of each transistor, at the same time.

The collector of the transistor 901 is inputted to the base of the transistor 904 via the resister R4.

The transistors 906, 905 and 904 are connected to the power supply 40 by connecting each emitter in common.

On the other hand, the bases of the transistors 903, 902 and 901 are connected to the BON control signal circuit, that is, the circuit (not shown in the diagram) selecting the BON 0, the BON 250 or the BON 500, via each of the base resisters R3 through R1.

Let us now consider in the case where the BON 250 circuit is set. A control signal for the BON 250 in supplied via the base resister R2 of the transistor 902. Accordingly, the transistor 902 turns ON and the transistor 905 also turns ON via the resister R5. Therefore, the power supply 40 is given to the BON 250 circuit 92 of each channel in common, so that each channel of the BON setting circuit are set to the BON 250.

Figure 19:
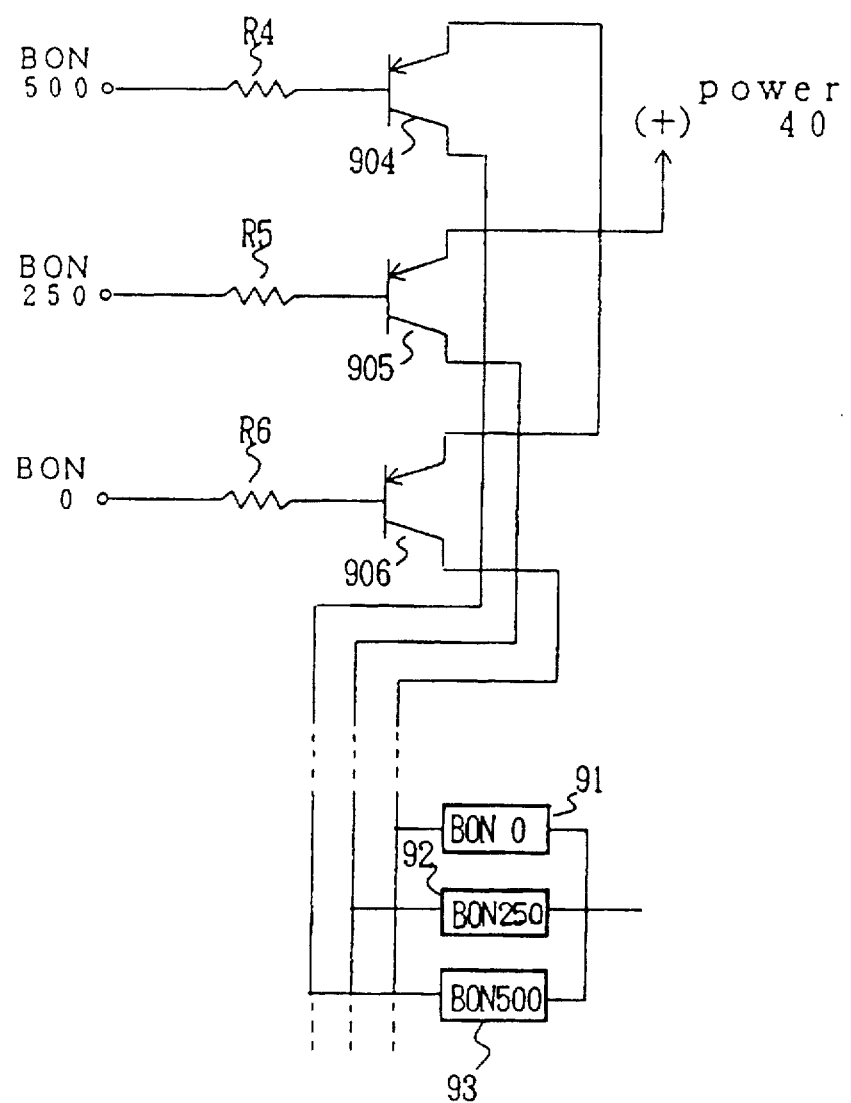
FIG. 19 is a diagram showing a second structural example of the switch circuit.

FIG. 19 is a diagram showing the second structural example of the switch circuit 90 in FIG. 17. The structural example of FIG. 19 constitutes a characteristic feature in that the signal having the negative pole is contributed as the BON control signal to the switch circuit 90, as compared with the embodiment of FIG. 18.

In this case, the transistors 903, 902 and 901 explained in FIG. 18, in addition to, the base resisters R3 through R1 of the transistors can be abbreviated. Accordingly, the structure of the switch circuit is simpler.

In the case where the signal is set in the BON 250 circuit, the control signal having the negative pole is supplied to the input connected to the base resister R5 of the transistor 905. When the control signal is given, the transistor 905 turns ON.

Accordingly, the power supply 40 is supplied to each channel of the BON 250 circuit 92 in common.

Figure 20:
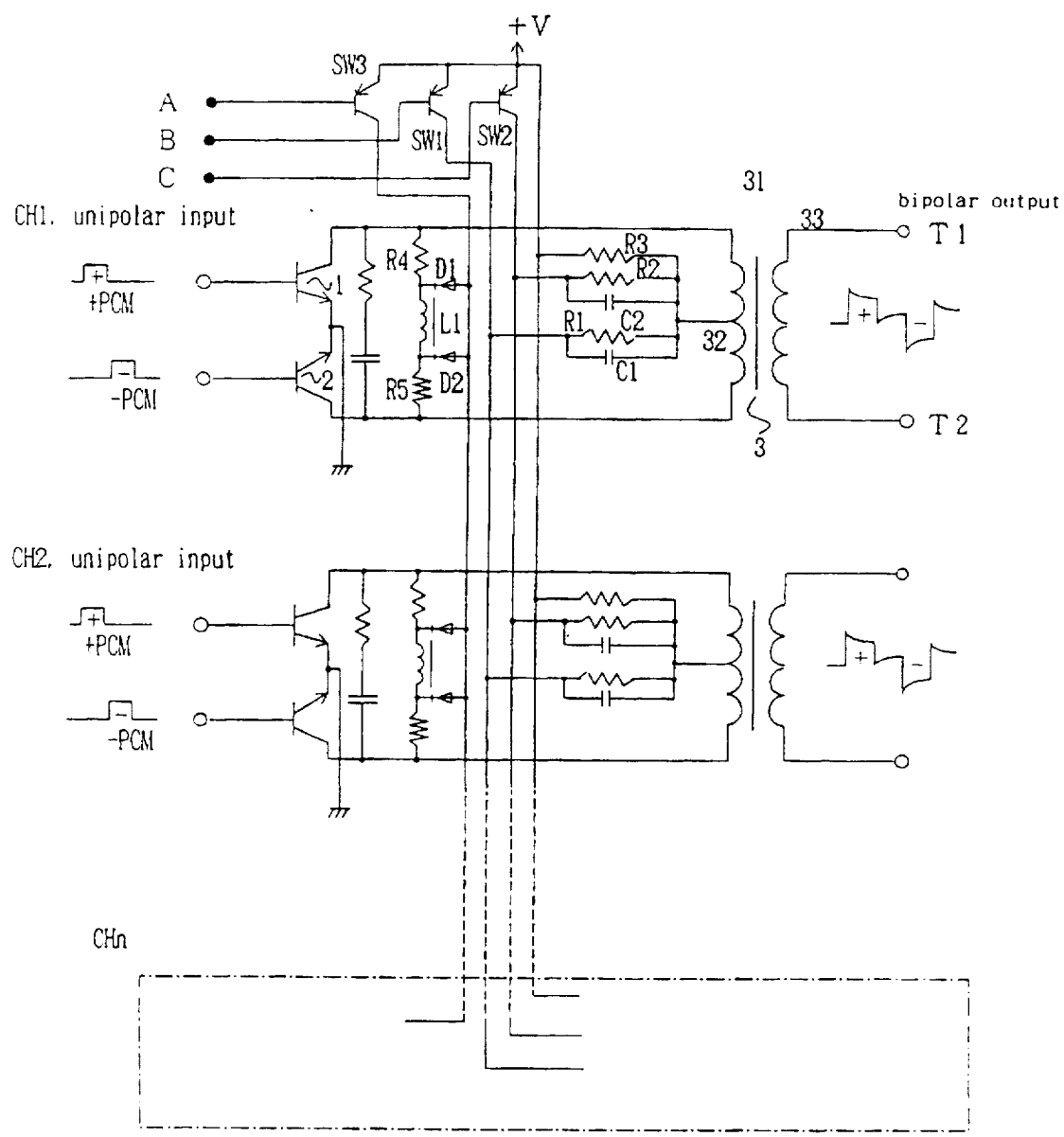
FIG. 20 is a diagram showing a sixth embodiment of the present invention.

FIG. 20 is a diagram showing the sixth embodiment of the present invention, including the switch circuit 90 and the BON circuits 91~93 shown in FIG. 17.

This embodiment of FIG. 20 is an example applied to the structure of the balanced line driver circuit as the above described in FIG. 14. Accordingly, the operation and feature are same as the above-explained in FIG. 14, the explanation is abbreviated, as it is overlapped.

Figures 21, 22:
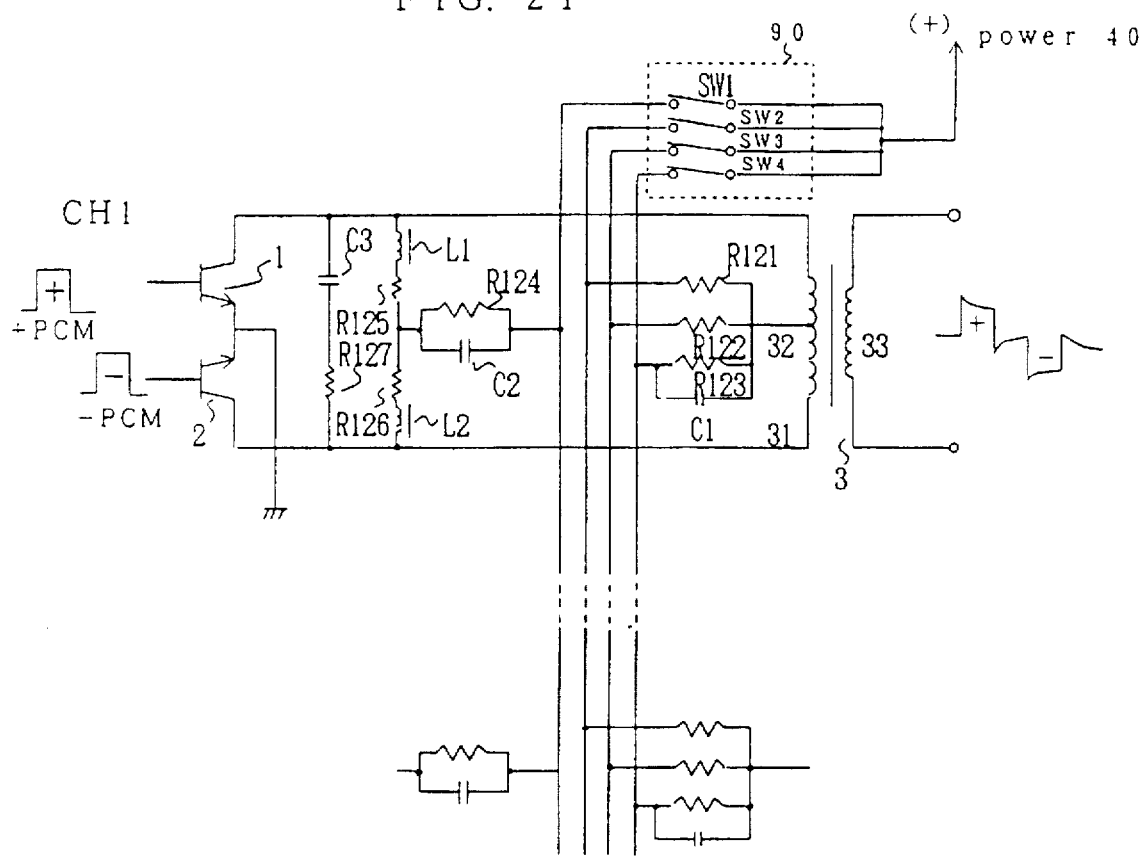
FIG. 21 is a diagram showing a seventh embodiment of the present invention.
FIG. 22 is a diagram showing the switching combination of the seventh embodiment.

FIG. 21 is a diagram showing the circuit of the seventh embodiment of the present invention.

In FIG. 21, the BON setting circuit of each channel includes the resisters R121 through R127, the capacitors C1 through C3 and the inductors L1 and L2.

As shown in the diagram, they are connected to the switches SW1 through SW4 of the switch circuit 90 by the four common wirings.

The switch 90 is the same as the structural example shown in FIGS. 18 and 19.

In this structure of FIG. 21, the examples of the BON 0 circuit 91, the BON 250 circuit 92 and the BON 530 circuit 93 are shown in FIG. 22 by the combination of each of the switches SW1 through SW4 constituting the switch circuit 90.

For example, the combination can be set by making only the switch SW3 to be in ON state and making the SW2 and SW4 to be in OFF state, when the BON 250 circuit 92 is used.

Figure 23:
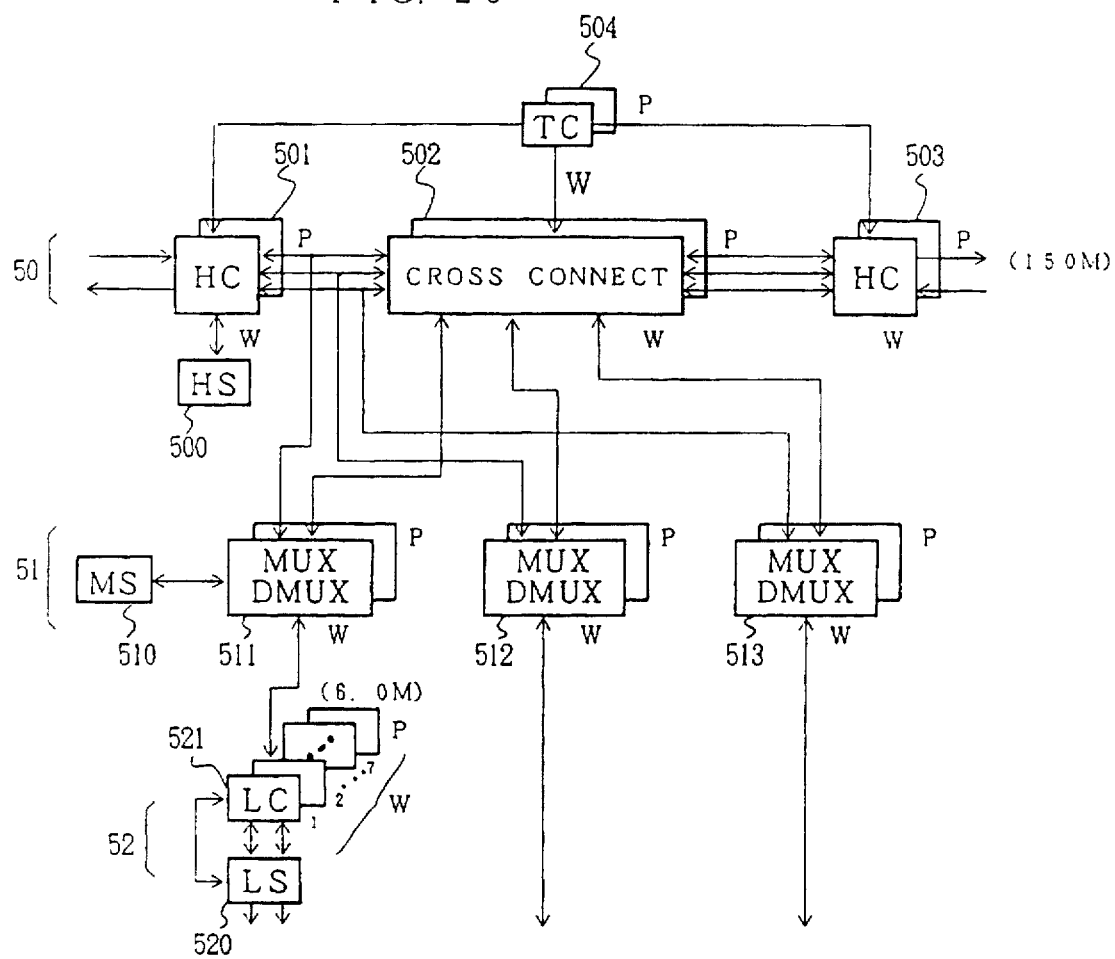
FIG. 23 is a diagram showing a second applied example of the circuit of the present invention.

FIG. 23 shows the second applied example of the circuit of the present invention, which is an applied example of the BON built-in type balanced line driver circuit having the BON setting circuit, for the plural channels as well as the first applied example shown in FIG. 16. Since the detailed explanation of the applied example is the same as shown in FIG. 16, it is abbreviated in here.

In FIG. 16, it was explained that the low-rank group channel panel 521 has seven sheets of the panels for work (W) and one sheet of the panel for protect (P), the circuits for 4 channels are stored in one sheet of channel panel and one BON built-in type balanced line driver circuit according to the present invention is stored for each one channel.

Hereupon, the circuits for four channels are jointly connected to an opposite station via the transmitting line, and the distance is equal for four channels.

Accordingly, the BON circuit inserted for compensating the distortion of the transmission line characteristic becomes equal for four channels.

Then, on the second applied example, the circuit shown in FIGS. 17 through 21 is provided per four channels, that is, each channel panel.

Therefore, the switch for the BON setting circuit for each channel in the same channel panel can be made in common. Accordingly, the structure of the balanced line driver circuit is simple.

Figure 24:
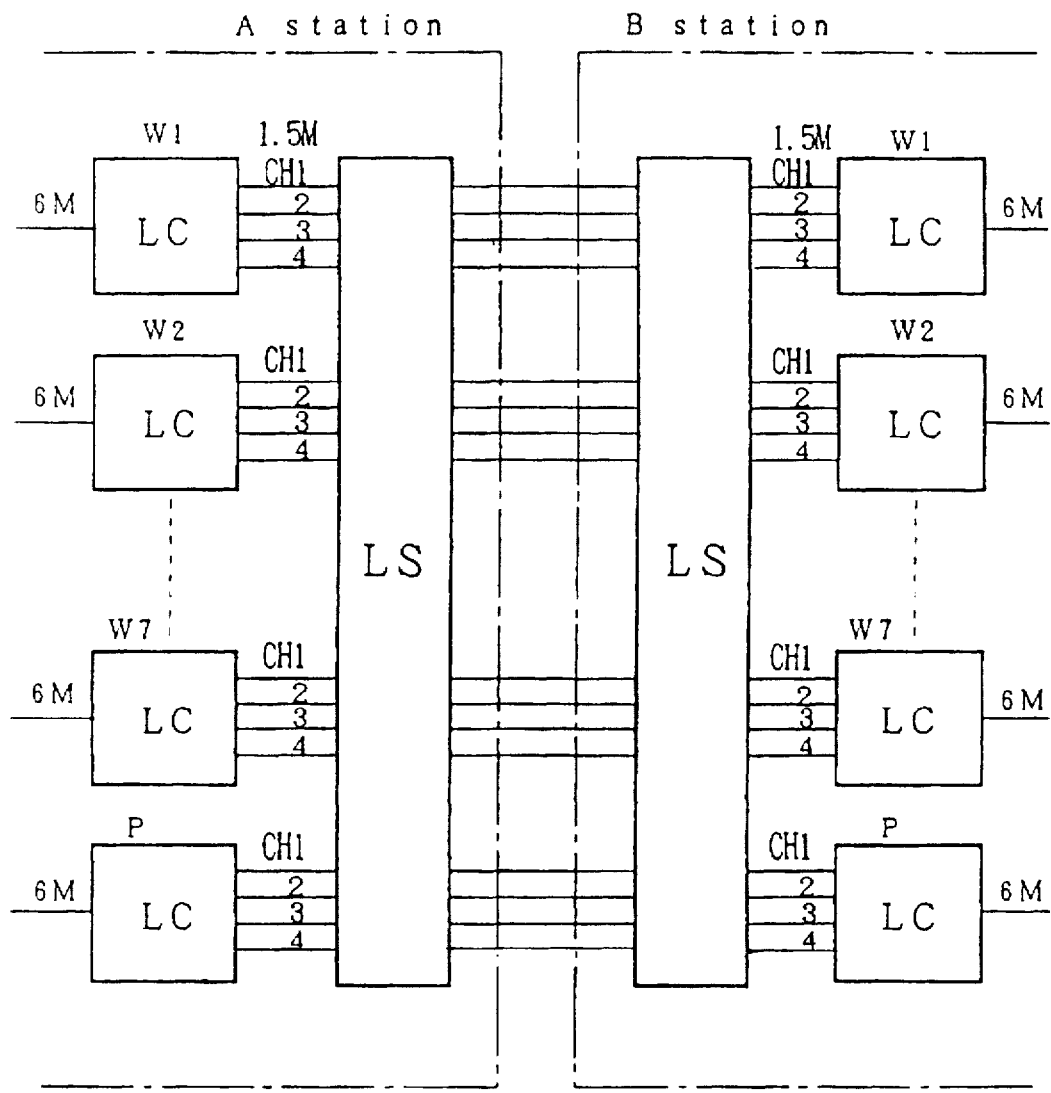
FIG. 24 is a diagram showing the relation between LC and LS.

FIG. 24 shows and explains this structure in the diagram. It shows the connecting relation between A station and B station, which are opposing each other.

In each of the stations A and B, the channel panels LC for work (W1~W7) and the channel panel LC for protect (P) receive the multiplexing signal of 6M and separate the signal to these four channels (CH1~CH4) and are connected to the low-speed switching circuit LS of the station.

The opposing station has the same structure, so that the signals for four channels which are received by the low-speed switching circuit LS are multiplexed to the signal of 6M in the channel panel LC.

On this structure, when the structure of the circuit of the present invention shown in FIGS. 17 through 21 is applied on the channel panels LC, the switch circuit of each channel panel LC becomes possible to make simple.

Further, although the transistors are used as the switch circuits 1 and 2 on the above-explained embodiment, the present invention is not limited to this example, and it is possible to arrange the transistors 1 and 2 to connect the collectors of both transistors 1 and 2 in common.

Figure 25:
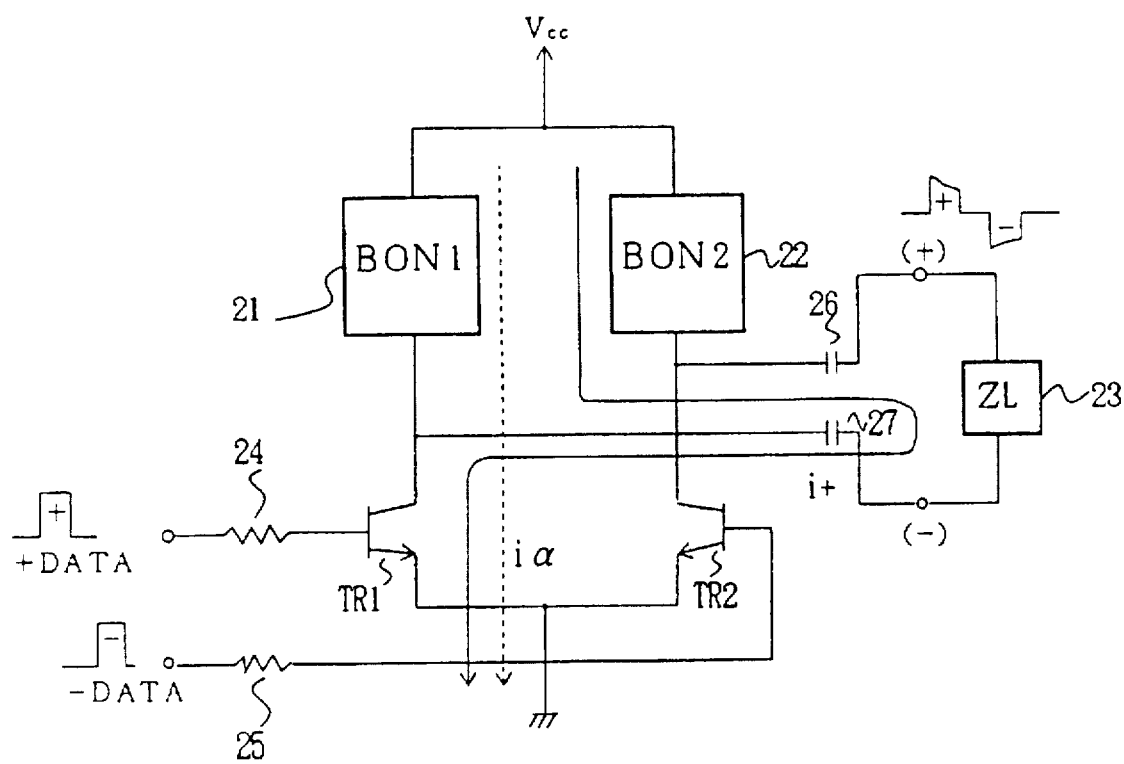
FIG. 25 is a diagram showing an eighth embodiment of the present invention.

FIG. 25 is an explanatory diagram of the eighth embodiment of the present invention. Further, the embodiment of the present invention, as the latter-explained, has a feature in the structure of the circuit, in which it becomes possible to exclude all of the transformers. Therefore, the equipment can be made compact, still more.

In FIG. 25, TR1 and TR2 are a pair of the transistors having a common emitter. In FIG. 25, these transistors are shown as the NPN type transistors.

Numerals "21" and "22" show the impedance circuits for setting BON which are provided between the collectors of a pair of transistors TR1 and TR2 and the voltage Vcc. In the embodiment of FIG. 25, these impedance circuits 21 and 22 have the same characteristic. Further, the characteristic of the balanced line, which is connected has the low-pass characteristic, so that the impedance circuits 21 and 22 have the reverse characteristic of the low-pass characteristic, that is, the high-pass characteristic, thus improving the line characteristic.

"23" is a load impedance, which is an impedance of the balanced line which is connected. "24" and "25" are the base resisters of a pair of transistors TR1 and TR2. "26" and "27" are direct-current stopping condensers.

Figure 26:
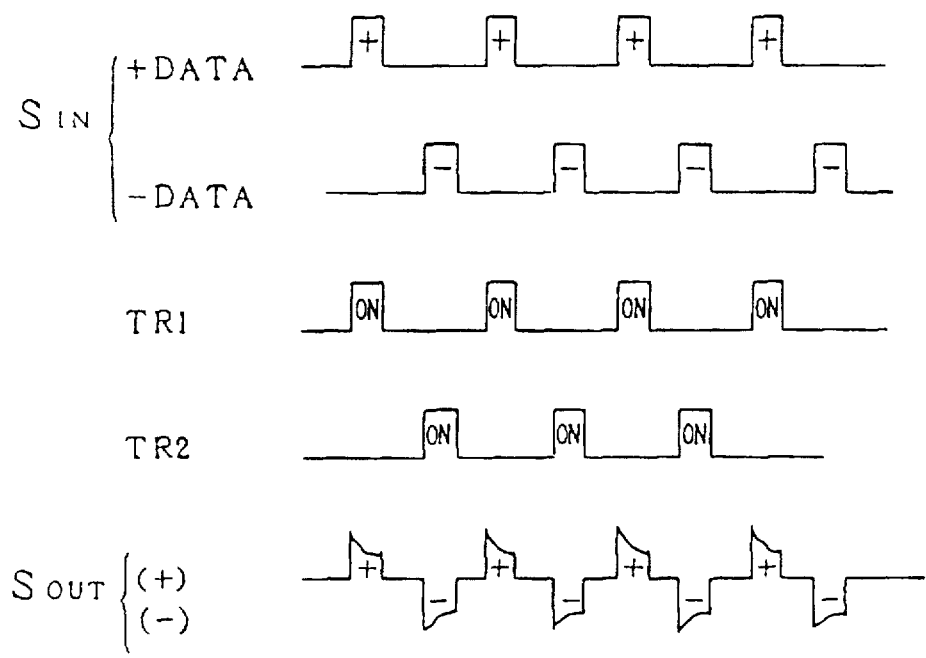
FIG. 26 is an explanatory diagram of the operation time chart of the eighth embodiment.

FIG. 26 is the operation time chart of the circuit in FIG. 25. The operation of FIG. 25 is explained referring to FIG. 26, as follows.

The unipolar signals +DATA and −DATA are inputted to the base of a pair of transistors TR1 and TR2, at the timing shown by the symbol "$S_{D1}$" in FIG. 26, alternately. When +DATA is inputted to the base of the transistor TR1, via the base resister 24, the transistor TR1 turns ON. And the current i+ from the voltage Vcc flows to the transistor TR1 via the impedance circuit 22, the condenser 26, the load impedance 23 and the condenser 27 for BON setting.

Then, the characteristic of the flowing current i+ is featured by the impedance circuit 22 for BON setting.

On the other hand, when −DATA is inputted to the base of the transistor TR2, via the base resister 25, the transistor TR2 turns ON. And the current i+ from the voltage Vcc flows to the transistor TR2, via the impedance circuit 21, the condenser 27, the load impedance 23 and the condenser 26 for BON setting.

Hereupon, the impedance circuits 21 and 22 are the circuits for giving the impedance characteristic which is the reverse characteristic to the frequency characteristic of the balanced line 5, to compensate the frequency characteristic, as it has already been explained relating to the conventional circuit. Accordingly, the output current flowing through the load impedance 23 of FIG. 25 becomes the bipolar signal as shown by the symbol "$S_{out}$" in FIG. 26, as it has the high-pass characteristic.

When the transistor TR1 is in ON state, for example, the dummy current iα flows other than the current i+ which flows to the load impedance on the circuit in FIG. 25. Accordingly, it is not an advantage to the consumption electric power.

Figure 27:
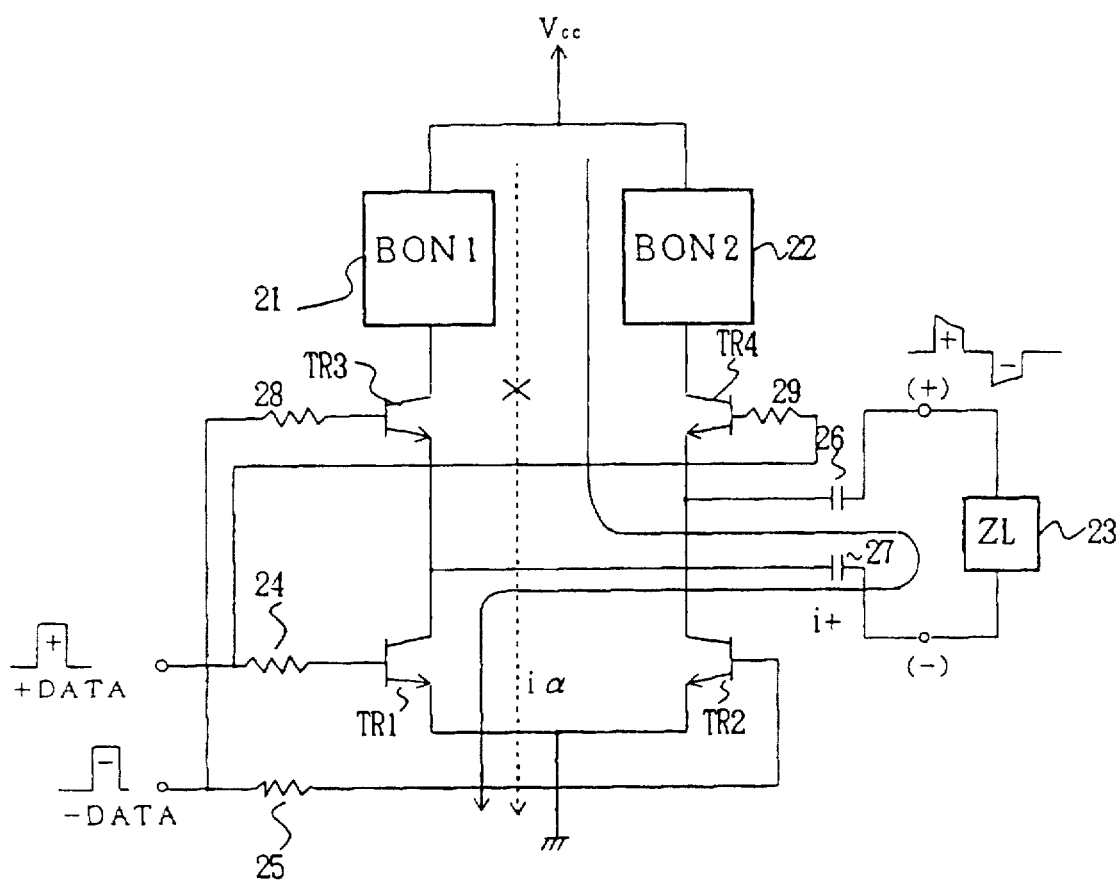
FIG. 27 is a diagram showing a ninth embodiment of the present invention.

The ninth embodiment of FIG. 27 shows the structure for solving the problem of the embodiment of FIG. 25. In the circuit of FIG. 27, the same numerals and symbols are shown as in FIG. 25.

The circuit of FIG. 27 constitutes a characteristic feature in that the transistors TR3 and TR4 are inserted between the collector of a pair of transistors TR1 and TR2 which have the common emitter and the impedance circuits 21 and 22.

The base of the transistor TR3 which is connected to the transistor TR1 is connected to the base of the transistor TR2.

On the other hand, the base of the transistor TR4 connected to the transistor TR2 is connected to the base of the transistor TR1.

When the transistor TR1 turns ON, by this structure, the transistor TR3 is turns OFF. Accordingly, the dummy current iα, which tends to flow to the transistor TR1 via the impedance circuit 21, is stopped by the transistor TR3. In this way, the problem of FIG. 25 is solved by the circuit of FIG. 27.

Figure 28:
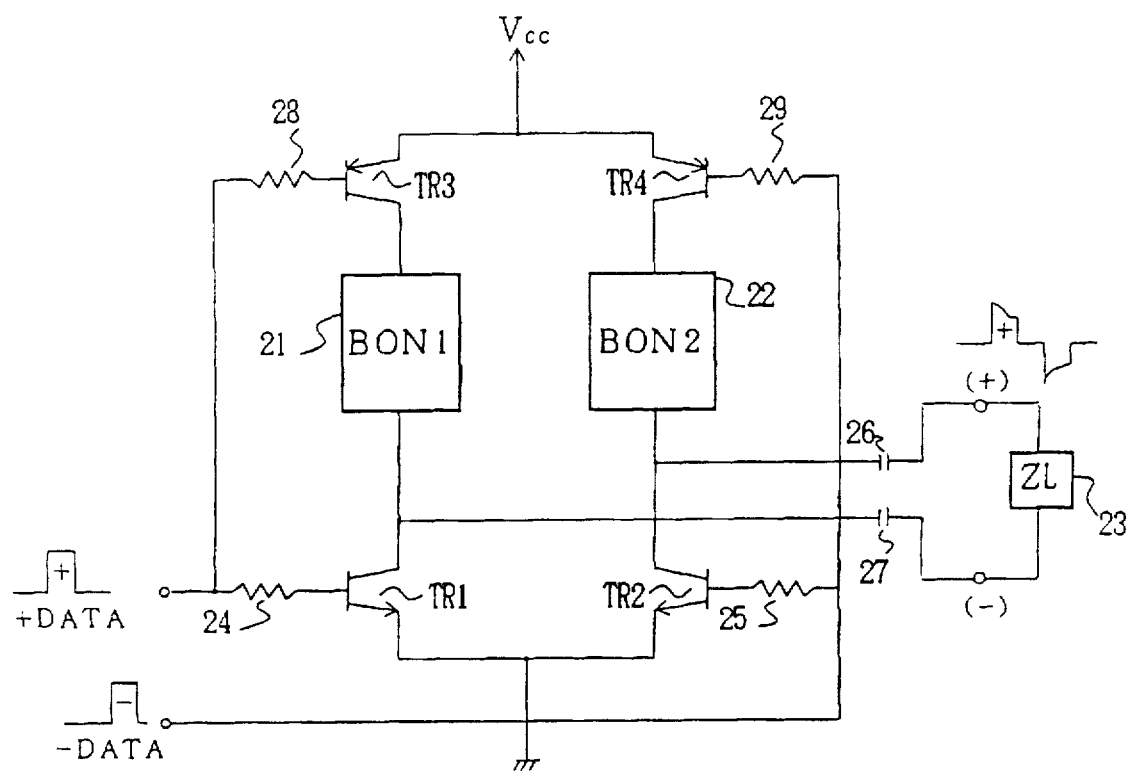
FIG. 28 is a diagram showing a tenth embodiment of the present invention

FIG. 28 shows the circuit of the tenth embodiment of the present invention. It shows the structure of the circuit for stopping the dummy current iα of FIG. 25 as shown in FIG. 27. The feature of the circuit shown in FIG. 28 is that a pair of the transistors TR3 and TR4, which are the reverse conductive type to the transistors TR1 and TR2, are inserted between the impedance circuits 21 and 22 and the voltage Vcc.

That is, a pair of transistors TR1 and TR2 are NPN type in the embodiment of FIG. 28, so that the transistors TR3 and TR4 are PNP type which is formed as the reverse conductive type.

Accordingly, when +DATA is inputted to the base of the transistor TR1, the transistor TR1 turns ON, but the transistor TR3 turns OFF. Accordingly, the dummy current which flows to the transistor TR1 via the impedance circuit 21 is stopped.

Figure 29:
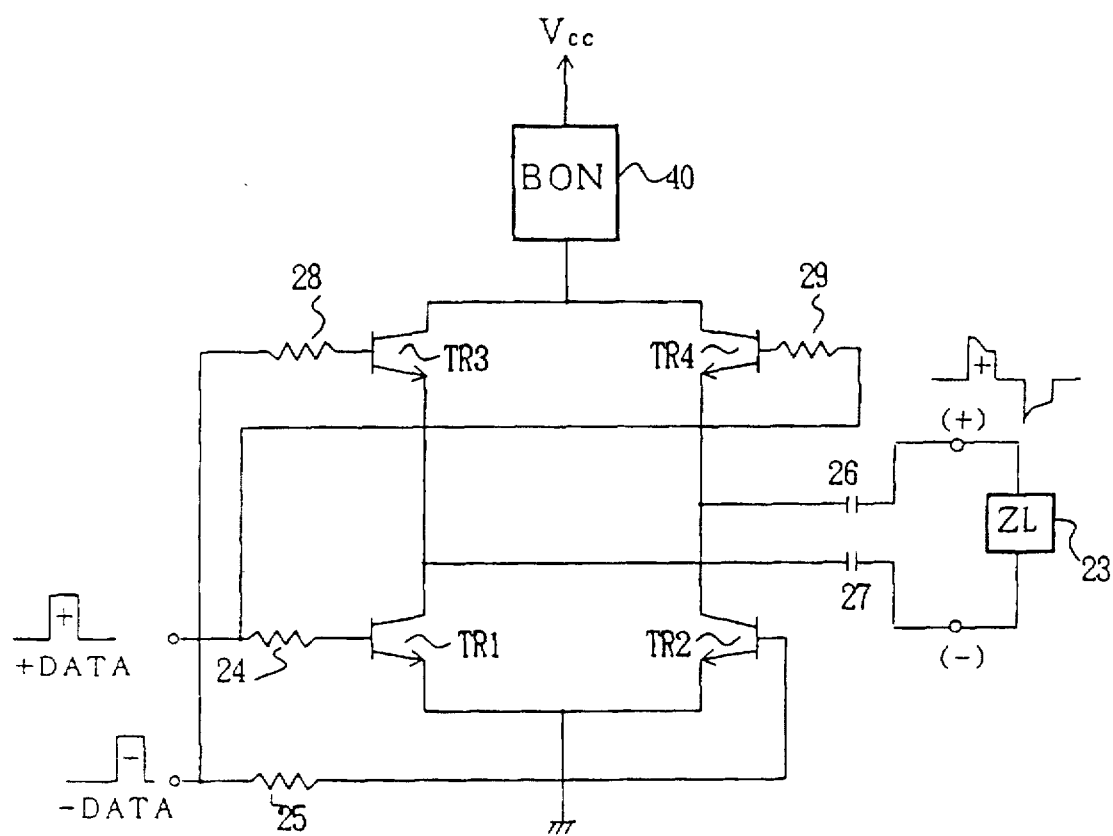
FIG. 29 is a diagram showing an eleventh embodiment of the present invention.

FIG. 29 shows the eleventh embodiment of the present invention, which has a structure for connecting the collectors of the transistors TR3 and TR4 in common using the impedance circuits 21 and 22 as the common impedance circuit 40, presupposing the ninth embodiment shown in FIG. 27.

By this structure, as the characteristic of the impedance circuits 21 and 22 is in common on the embodiment of FIG. 27, it is possible to obtain the same function with one impedance circuit 40 used in common. Accordingly, it becomes possible to reduce the structure of the circuit. As other functions and operation of the circuit are the same as the circuit shown in FIG. 27, the explanation of the function and the operation is abbreviated, here.

Figure 30:
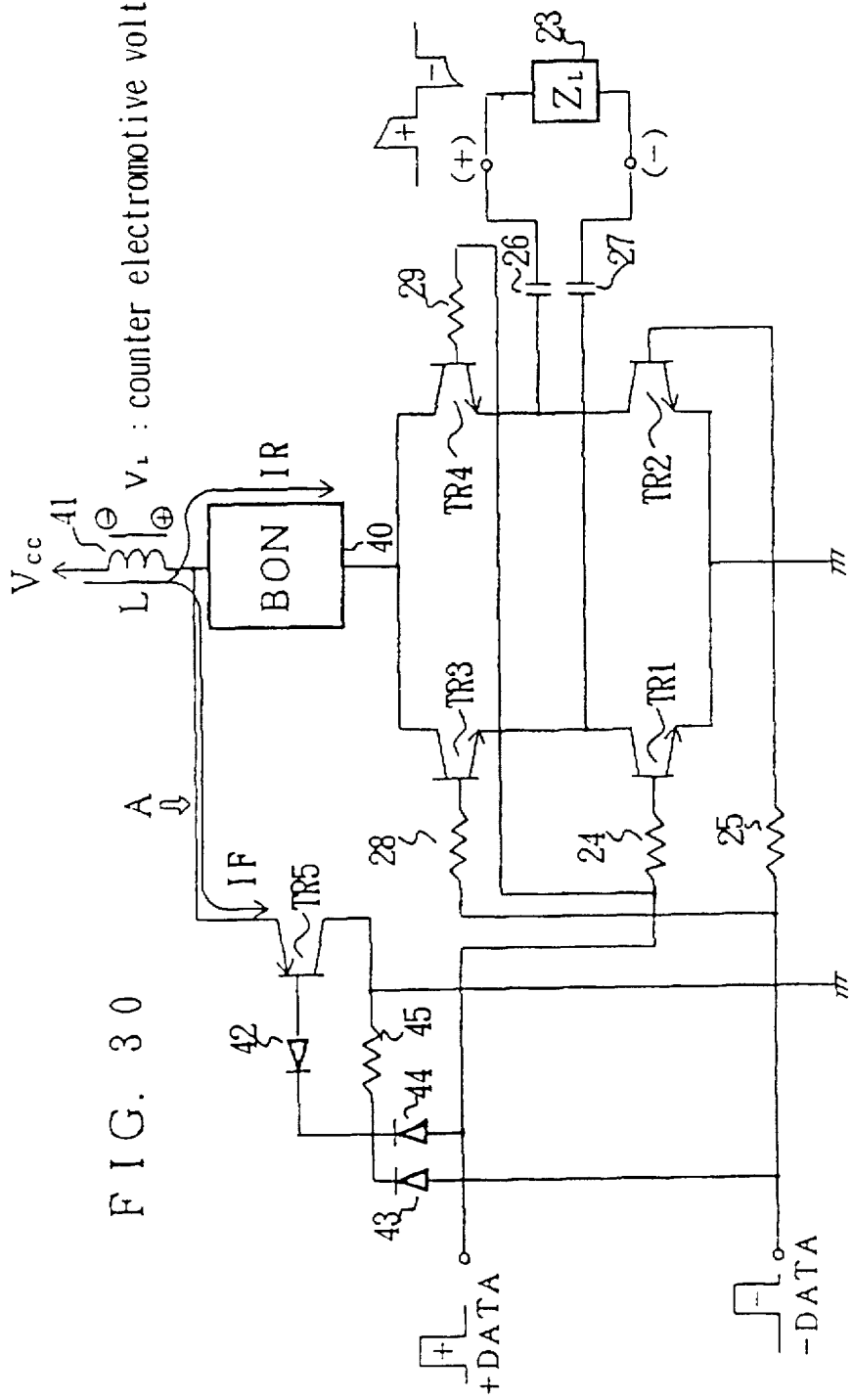
FIG. 30 is a diagram showing a twelfth embodiment of the present invention.

FIG. 30 shows the circuit of the twelfth embodiment of the present invention. As the above-explained, the circuit of the present invention also has a structure of deleting transformers. Accordingly, it does not has a boosting function. Therefore, the amplitude of the output signal would not be enough. FIG. 30 shows the embodiment for solving these problems.

Figures 31, 36:
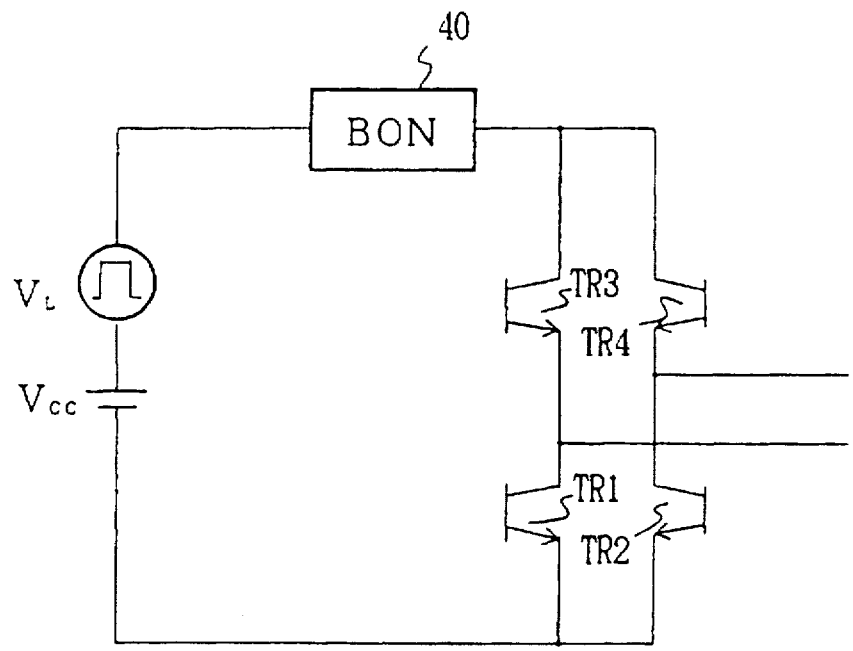
FIG. 31 is an explanatory diagram of the operation of the twelfth embodiment.
FIG. 36 is a diagram showing the switching combination of the fifteenth embodiment.
Figure 32:
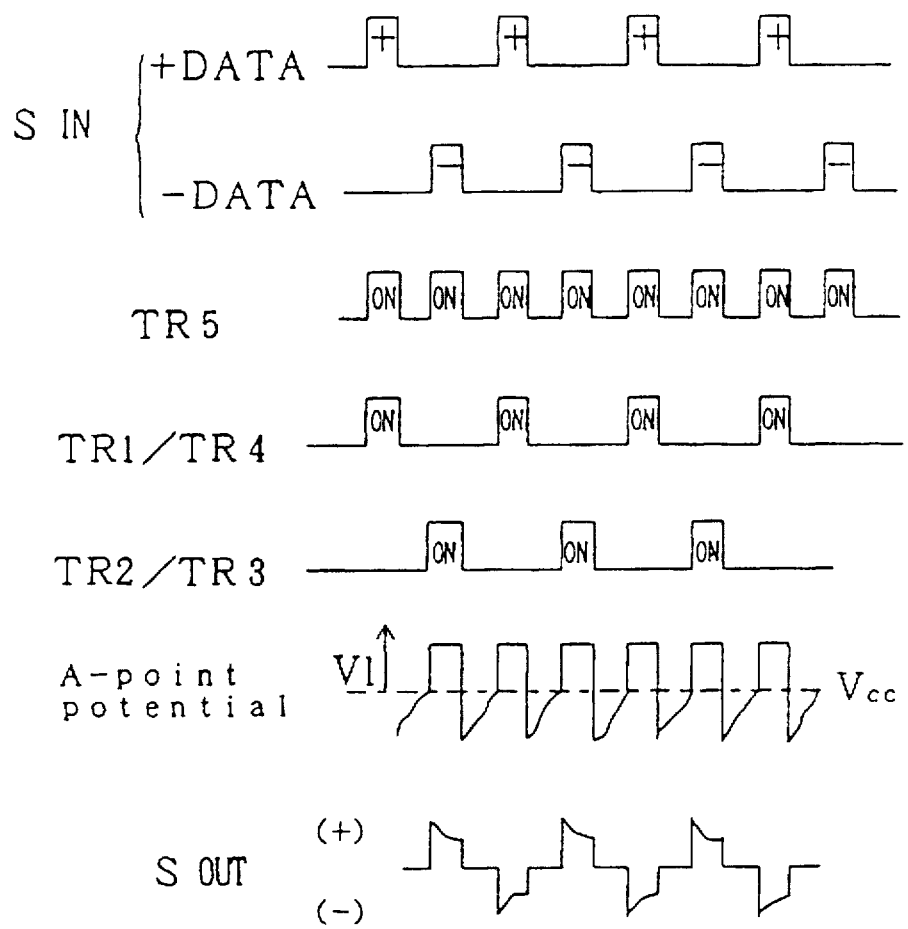
FIG. 32 is an explanatory diagram of the operation time chart of the twelfth embodiment.

FIG. 31 is a diagram explaining the operation of the circuit of FIG. 30. FIG. 32 is an operation time chart of the circuit of FIG. 30. That is, the circuit of FIG. 30 has a booster coil 41 between the common impedance circuit 40 and the voltage Vcc.

The structure of FIG. 30 shows that the shortage of the amplitude of the output signal is supplied by adding the counter electromotive voltage VL induced on the booster coil 41 to the electric source voltage Vcc.

Let us now consider the case where the state of the transistor TR5 is turned from ON to OFF, or TR1/TR4 or TR2/TR3 is turned from OFF to ON. Then, the current flowing to the transistor TR5 is regarded as If, and the current flowing to the transistors TR1/TR4 or TR2/TR3 is regarded as Ir. When the condition of If>Ir is kept, the current flowing to the booster coil 41 is reduced and the counter electromotive voltage VL is generated, so that the potential at A point of FIG. 30 is as shown in FIG. 32.

Accordingly, when the transistors TR1/TR4 or the transistors TR2/TR3 are in ON state, the voltage having the added value of the power supply voltage Vcc and the counter electromotive voltage VL is applied to the impedance circuit 40 which is the BON circuit. Thus, the larger amplitude of the output signal can be obtained as shown in the symbol "$S_{out}$" in FIG. 32.

Further, the diodes 42 through 44 fulfill their function of stopping the counter electromotive voltage in FIG. 30.

Figure 33:
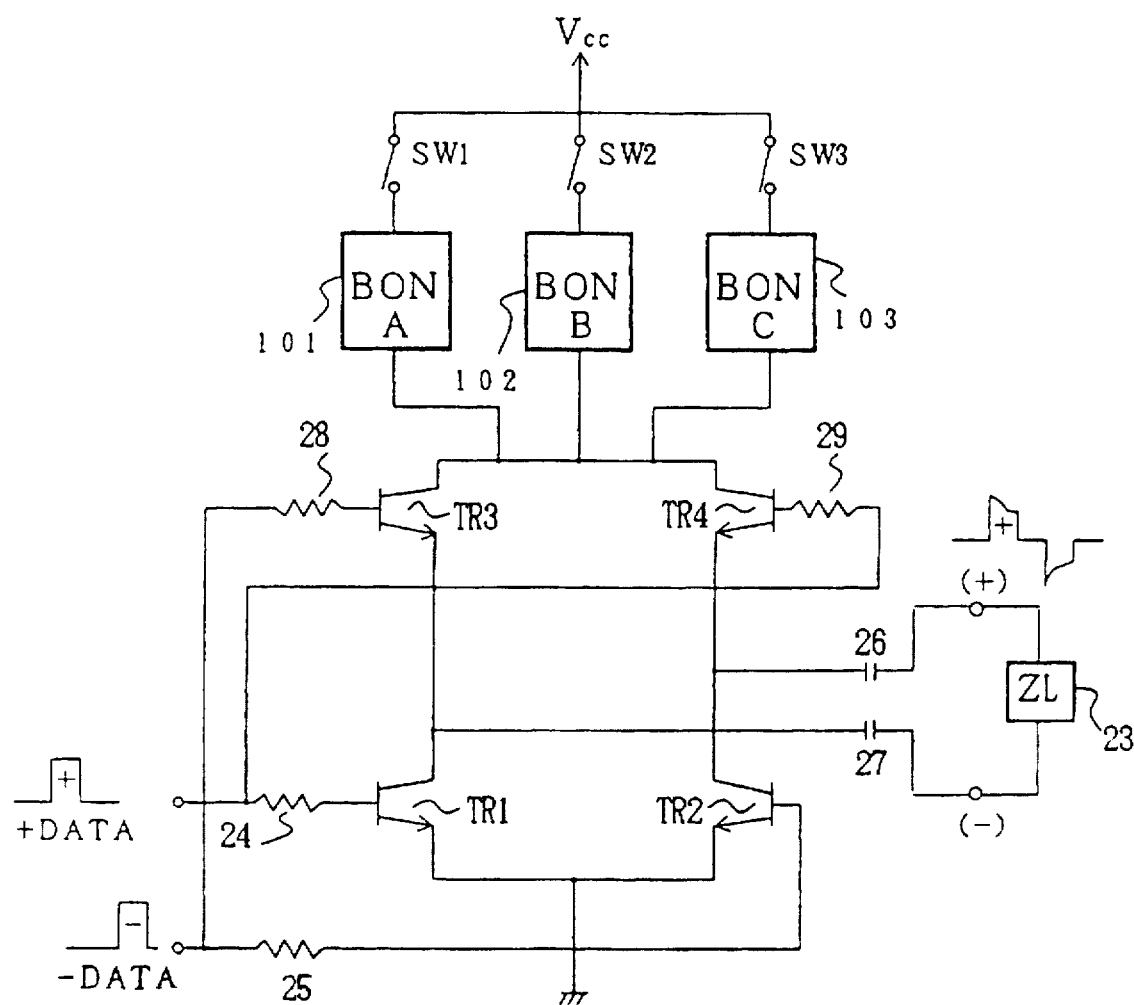
FIG. 33 is a diagram showing a thirteenth embodiment of the present invention.

FIG. 33 is a circuit of the thirteenth embodiment of the present invention. This embodiment shows that the impedance circuit, which becomes the BON setting circuit, is selected and connected in the case where the circuit is connected to the different balanced line presupposing the embodiment of FIG. 29.

Accordingly, the common impedance circuit 40 of FIG. 29 is constituted so as to be a plurality of impedance circuits 101 through 103. Further, each of impedance circuits 101 through 103 is connected to the voltage Vcc with other switches SW1 through SW3.

Either of the impedance circuits 101 through 103 is selected with the balanced line length which is connected and disconnected to the voltage Vcc with the switches SW1 through SW3. The other functions and operation are the same as explained in FIG. 29.

Figure 34:
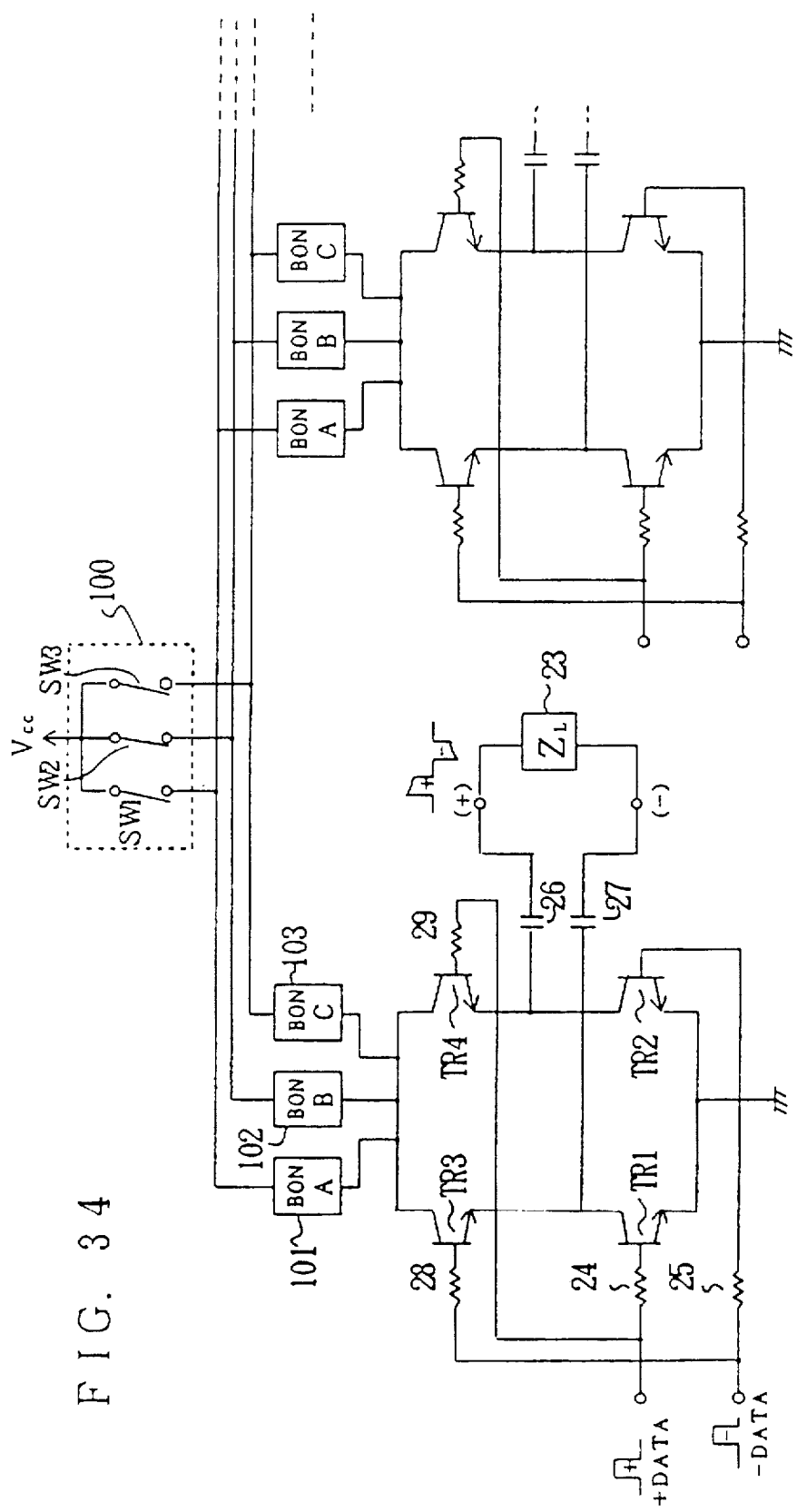
FIG. 34 is a diagram showing a fourteenth embodiment of the present invention.

FIG. 34 shows the circuit of the fourteenth embodiment of the present invention. This is an embodiment in the case where it is applied to the subscriber line termination equipment constituted so as that the plural channels are connected to the balanced transmitting line, so that the structure of the equipment can be reduced by making the switches SW1 through SW3 of FIG. 33 to each channel in common.

That is, the BON setting circuit for each channel is in common, based on the circuit of FIG. 33, and each of the impedance circuits 101 through 103 of the BON setting circuit are connected to the common switch circuit 100. The common switch circuit 100 has the plural switches SW1 through SW3. Each of switches are connected to the impedance circuits 101 through 103 which are corresponded to each channel.

FIG. 35 is a diagram showing the structure in the case where the present invention is applied to the subscriber line termination equipment as the fifteenth embodiment of the present invention. The basic structure of the case for applying the present invention to the subscriber line termination equipment is the same as explained in FIG. 34. Further, in this embodiment, it has the booster coil 61 and the transistor TR5 and the like explained in FIG. 30, so that the amplitude of the output becomes larger.

Further, the embodiment of FIG. 30 is considered so as to be possible to perform the fine approximate compensating. As it is understood from the comparison with the fourteenth embodiment of the present invention in FIG. 34, the switch circuit 100 has the switches SW1 through SW4, the switch SW2 through SW4 are connected to the impedance circuit (which is constituted of the resisters 66 and 67 and the resister/condenser parallel circuit 68) between the common collector of the transistors TR3 and TR4 and the switch circuit 100 as same as the embodiment of FIG. 34.

On the other hand, in FIG. 35, the impedance circuits 71 and 72 are inserted between the emitter of the transistors TR3 and TR4. Further, the switch SW1 is connected to the impedance circuit 70 inserted between the impedance circuit 71 and the switch SW1.

In this structure of the circuit, it becomes possible to select the impedance circuit as to suit the balanced line length which is connected and compensate the line characteristic of the relevant balanced line by the combination of the switches SW1 through SW4.

FIG. 36 shows one example showing the relation between the combination of the switches SW1 through SW4 and the balanced line length. That means, the switches SW1 and SW2 are ON, in the case where the line having the line length to the extent of 250 feet are connected.

Further, in the case where the line is connected to the line length of 250~500 feet, only the switch SW3 is ON. Furthermore, in the case where the line is connected to the line length of 500~750 feet, only the switch SW4 is ON.

Further, it is possible to apply even the transformerless type BON built-in type balanced line driver circuit of the present invention explained in FIG. 25 and after FIG. 25 to the subscriber line termination equipment as same as the applied example in FIGS. 16 and 23 as the above-explained.

Further, although the example for using the transistor as the switch circuits 1 and 2, and connecting these emitters in common is shown on the explanation of the first embodiment through the seventh embodiment as the above described. The present invention is not limited to the above-described embodiments and it is also possible to connect the collector of both transistors in common, according to the present invention.

The BON built-in type balanced line driver circuit according to the present invention can be formed by providing only one impedance circuit as a compensating circuit for compensating the frequency characteristic of the balanced line 5 and the U/B converting transformer can be omitted.

Accordingly, it becomes possible to reduce the size of the equipment, in the case where the balanced line driver circuit according to the present invention is applied to the channel unit.

Although the present invention has been described with reference to the embodiments, the invention is not restricted to those embodiments.

It should of course be understood that those embodiments which are the same as the technical concept of the invention are within the protective scope of this invention.

What is claimed is:

1. A BON built-in type balanced line driver circuit comprising:

a pair of transistors, the emitters of which are connected in common; and an impedance circuit connected between a power supply and respective collectors of the pair of the transistors having the reverse characteristic of line characteristic of a balanced line connected between the collectors of the pair of transistors, the respective bases of the pair of transistors being supplied with unipolar data pulses (+DATA, −DATA).

2. A BON built-in type balanced line driver circuit according to claim 1, further comprising;

third and fourth transistors inserted between each of collectors of said pair of transistors and the impedance circuit, wherein a base of said third transistor is coupled to the base of the second transistor and a base of said fourth transistor is coupled to the base of the first transistor.

3. A BON built-in type balanced line driver circuit according to claim 2, wherein said impedance circuit is made to be a common impedance circuit, the collectors of the third and fourth transistors are connected in common, and said common impedance circuit is connected between said common collector and the power supply.

4. A BON built-in type balanced line driver circuit according to claim 3, wherein a booster coil L is further provided between said common impedance circuit and the power supply.

5. A BON built-in type balanced line driver circuit according to claim 3, wherein said common impedance circuit has plural impedance components, each having the reverse characteristic of the line characteristic of different balanced line length, plural switches are further provided between each of said plural impedance components and the power supply, and the reverse characteristic of the line characteristic of the balanced line length which is connected is given by selecting said switches.

6. A BON built-in type balanced line driver circuit according to claim 1, wherein transistors which have the reverse conductive type to that of said pair of transistors are further provided between the impedance circuit and the power supply, and the bases of said transistors of the reverse conductive type are respectively connected to the base of each pair of the transistors on the side where each of the transistors of the reverse conductive type is inserted.

7. Subscriber line termination equipment for converting an optical multiplexing signal of the high-rank group to a bipolar electric signal of the low-rank group and said bipolar electric signal of the low-rank group to the optical multiplexing signal, said subscriber line termination equipment comprising:

a BON built-in type balanced line driver circuit comprising:

a first pair of transistors, the emitters of which are connected in common;

a second pair of transistors, the collectors of which are connected in common, the collectors of the first pair of transistors being connected to the emitters of the second pair of transistors and the bases of the first pair of transistors being connected to the bases of the transistors on the side where the collectors of the first pair of transistors are not respectively connected to the collectors of the second pair of transistors;

plural impedance circuits of which one ends are connected to said collectors of the second pair of transistors, and a common switch circuit having plural switches provided between said Plural impedance circuits and the power supply, wherein the BON built-in type balanced line driver circuit is provided to a channel unit.

8. A BON built-in type balanced line driver circuit comprising:

a first pair of transistors, the emitters of which are connected in common;

a second pair of transistors, the collectors of which are connected in common;

the collectors of the first pair of transistors being connected to the emitters of the second pair of transistors and the bases of the first pair of transistors being connected to the bases of the transistors on the side where the collectors of the first pair of transistors are not respectively connected to the collectors of the second pair of transistors;

plural impedance circuits of which one end of each of the plural impedance circuits is connected to said collectors of the second pair of transistors;

a common switch circuit comprising plural switches provided between said plural impedance circuits and a power supply and a balanced line connected between the collectors of the second Pair of transistors and the emitters of the first pair of transistors, said balanced line comprising line characteristics, wherein said plural impedance circuits comprise reverse characteristics of the line characteristics of the balanced line.

9. A build-out Network (BON) built-in type balanced line driver circuit coupled to a power supply and comprising:

a pair of transistors, said pair of transistors comprising:

a first transistor, said first transistor comprising a first emitter, a first collector, and a first base, and a second transistor, said second transistor comprising a second emitter, a second collector, and a second base, said second emitter coupled to the first emitter;

a balanced line including a line characteristic, said balanced line coupled to the first collector and to the second collector; and an impedance circuit coupled in series between the power supply and the balanced line, the first collector, and the second collector, said impedance circuit including a reverse characteristic of the line characteristic, wherein the first base and the second base are respectively receiving unipolar data pulses.

10. A build-out Network (BON) built-in type balanced line driver circuit coupled to a power supply and comprising:

a first transistor, said first transistor comprising a first emitter, a first collector, and a first base;

a second transistor, said second transistor comprising a second emitter, a second collector, and a second base, said second emitter coupled to the first emitter;

a third transistor comprising a third collector, a third base, and a third emitter, said third emitter coupled to said first collector and said third base coupled to said second base;

a fourth transistor comprising a fourth collector, a fourth base, and a fourth emitter, said fourth emitter coupled to said second collector and said fourth base operatively coupled to said first base;

a balanced line including a line characteristic, said balanced line operatively to the first collector and to the second collector; and an impedance circuit coupled in series between the power supply the third collector, and the fourth collector, said impedance circuit including a reverse characteristic of the line characteristic, wherein the first base and the second base are respectively receiving unipolar data pulses.

11. A build-out Network (BON) built-in type balanced line driver circuit coupled to a power supply and comprising:

a pair of transistors, said pair of transistors including a first conductive type and comprising:

a first transistor, said first transistor comprising a first emitter, a first collector, and a first base, and a second transistor, said second transistor comprising a second emitter, a second collector, and a second base, said second emitter coupled to the first emitter;

a third transistor including a second conductive type opposite to the first conductive type and comprising a third emitter, a third collector, and a third base, said third emitter coupled to the power supply and said third base coupled to the first base;

a fourth transistor including the second conductive type and comprising a fourth emitter, a fourth collector, and a fourth base, said fourth emitter coupled to the power supply and said fourth base coupled to the second base;

a balanced line including a line characteristic, said balanced line coupled to the first collector and to the second collector; and an impedance circuit coupled in series between the third collector and the fourth collector, and the balanced line, the first collector, and the second collector, said impedance circuit including a reverse characteristic of the line characteristic, wherein the first base and the second base are respectively receiving unipolar data pulses.

12. A build-out Network (BON) built-in type balanced line driver circuit coupled to a power supply and comprising:

a first transistor, said first transistor comprising a first emitter, a first collector, and a first base;

a second transistor, said second transistor comprising a second emitter, a second collector, and a second base, said second emitter coupled to the first emitter;

a third transistor comprising a third collector, a third base, and a third emitter, said third emitter coupled to said first collector and said third base coupled to said second base;

a fourth transistor comprising a fourth collector, a fourth base, and a fourth emitter, said fourth emitter coupled to said second collector, said fourth collector coupled to said third collector, and said second base coupled to said third base;

a balanced line including a line characteristic, said balanced line coupled to the first collector and to the second collector; and a common impedance circuit coupled in series to the power supply, and to the third collector and the fourth collector, said impedance circuit including a reverse characteristic of the line characteristic, wherein the first base and the second base are respectively receiving unipolar data pulses.

13. A BON built-in type balanced line driver circuit according to claim 12, wherein a booster coil L is provided between said common impedance circuit and the power supply.

14. A BON built-in type balanced line driver circuit according to claim 12, wherein said common impedance circuit comprises plural impedance circuit components, each of the plural impedance circuit components respectively including a reverse characteristic of the line characteristic corresponding to a different balanced line length, plural switches are further provided between each of said plural impedance circuit components and the power supply, and the reverse characteristic of the line characteristic of the balanced line length which is connected is provided by selecting said switches.

15. A build-out Network (BON) built-in type balanced line driver circuit coupled to a power supply and comprising:

a first pair of transistors, said first pair of transistors comprising:

a first transistor, said first transistor comprising a first emitter, a first collector, and a first base, and a second transistor, said second transistor comprising a second emitter, a second collector, and a second base, said second emitter coupled to the first emitter;

a second pair of transistors, said second pair of transistors comprising:

a third transistor, said third transistor comprising a third emitter, a third collector, and a third base, said third emitter coupled to said first collector, and said third base coupled to said second base, and a fourth transistor, said fourth transistor comprising a fourth emitter, a fourth collector, and a fourth base, said fourth emitter coupled to the second collector, and said fourth base coupled to said first base;

a common switch circuit coupled to the power supply;

plural impedance circuits, each of said plural impedance circuits coupled in series to the common switch circuit and to the third collector and the fourth collector; and a balanced line coupled to the first collector and to the second collector, said balanced line comprising line characteristics, wherein said plural impedance circuits comprise reverse characteristics of the line characteristics of the balanced line.

16. Subscriber line termination equipment converting an optical multiplexing signal of a high-rank group to a bipolar electric signal of a low-rank group and said bipolar electric signal of the low-rank group to an optical multiplexing signal, said subscriber line termination equipment corresponding to a channel unit and comprising:

a build-out Network (BON) built-in type balanced line driver circuit coupled to a power supply and comprising:

a first pair of transistors, said first pair of transistors comprising:

a first transistor, said first transistor comprising a first emitter, a first collector, and a first base, and a second transistor, said second transistor comprising a second emitter, a second collector, and a second base, said second emitter coupled to the first emitter;

a second pair of transistors, said second pair of transistors comprising:

a third transistor, said third transistor comprising a third emitter, a third collector, and a third base, said third emitter coupled to said first collector, and said third base coupled to said second base, and a fourth transistor, said fourth transistor comprising a fourth emitter, a fourth collector, and a fourth base, said fourth emitter coupled to the second collector, and said fourth base coupled to said first base;

a common switch circuit coupled to the power supply; and plural impedance circuits, each of said plural impedance circuits coupled in series to the common switch circuit and to the third collector and the fourth collector, wherein said BON built-in type balanced line driver circuit is provided to the channel unit.

\* \* \* \* \*